(12) United States Patent
Honda et al.

(10) Patent No.: US 10,290,468 B2
(45) Date of Patent: May 14, 2019

(54) ELECTRODE FOR PLASMA PROCESSING APPARATUS, PLASMA PROCESSING APPARATUS, PLASMA PROCESSING METHOD AND STORAGE MEDIUM

(71) Applicant: TOKYO ELECTRON LIMITED, Tokyo-To (JP)

(72) Inventors: Masanobu Honda, Nirasaki (JP); Shinji Himori, Nirasaki (JP)

(73) Assignee: TOKYO ELECTRON LIMITED, Tokyo-To (JP)

(*) Notice: Subject to any disclaimer, the term of this patent is extended or adjusted under 35 U.S.C. 154(b) by 553 days.

(21) Appl. No.: 14/026,006

(22) Filed: Sep. 13, 2013

(65) Prior Publication Data
US 2014/0027059 A1    Jan. 30, 2014

Related U.S. Application Data

(63) Continuation of application No. 12/379,052, filed on Feb. 11, 2009, now abandoned.
(Continued)

(30) Foreign Application Priority Data

Feb. 29, 2008 (JP) .................................. 2008-050745

(51) Int. Cl.
*C23C 16/00* (2006.01)
*C23F 1/00* (2006.01)
(Continued)

(52) U.S. Cl.
CPC .... *H01J 37/32009* (2013.01); *H01J 37/3244* (2013.01); *H01J 37/32091* (2013.01); *H01J 37/32449* (2013.01); *H01J 37/32541* (2013.01)

(58) Field of Classification Search
USPC ............ 156/345.33, 345.34, 345.43–345.47; 118/715, 724, 723 E
See application file for complete search history.

(56) References Cited

U.S. PATENT DOCUMENTS 5,460,684 A * 10/1995 Saeki .................. C23C 16/4586
118/723 E
7,722,719 B2 * 5/2010 Lei ..................... H01J 37/32082
118/715
(Continued)

FOREIGN PATENT DOCUMENTS

JP        2000-323456       11/2000
JP        2002-534797 A     10/2002
(Continued)

OTHER PUBLICATIONS

Machine English Translation JP2000323456, Koshiishi dated Nov. 24, 2000.

*Primary Examiner* — Rakesh K Dhingra
(74) *Attorney, Agent, or Firm* — Smith, Gambrell & Russell, LLP.

(57) ABSTRACT

The present invention provides an upper electrode and an etching apparatus including the electrode, both of which can properly reduce the intensity of the electric field of plasma around a central portion of a substrate, thus enhancing in-plane uniformity. In this apparatus, a recess, serving as a space for allowing a dielectric to be injected therein, is provided around a central portion of the upper electrode. Both a dielectric supply passage and a dielectric discharge passage are connected with the space. With such configuration, controlled supply of the dielectric into the recess makes the in-plane electric field intensity distribution uniform over various process conditions, such as the kind of wafer to be etched, the processing gas to be used, and the like.

6 Claims, 14 Drawing Sheets

Related U.S. Application Data

(60) Provisional application No. 61/071,556, filed on May 6, 2008.

(51) Int. Cl.
  *H01L 21/306* (2006.01)
  *H01J 37/32* (2006.01)

(56) References Cited

U.S. PATENT DOCUMENTS

| | | |
|---|---|---|
| 8,025,731 B2 | 9/2011 | Ni et al. |
| 2001/0010257 A1 | 8/2001 | Ni et al. |
| 2002/0088545 A1 | 7/2002 | Lee et al. |
| 2003/0070620 A1 | 4/2003 | Cooperberg et al. |
| 2003/0086840 A1* | 5/2003 | Himori ............ H01J 37/32082 422/186.04 |
| 2003/0137250 A1* | 7/2003 | Mitrovic ........... H01J 37/32082 315/111.21 |
| 2004/0129224 A1* | 7/2004 | Yamazaki ........... C23C 16/4401 118/724 |
| 2004/0134611 A1 | 7/2004 | Kato et al. |
| 2004/0149394 A1* | 8/2004 | Doan ................ H01J 37/32009 216/67 |
| 2005/0000423 A1* | 1/2005 | Kasai ................ C23C 16/45565 118/715 |
| 2005/0145341 A1 | 7/2005 | Suzuki |
| 2005/0241769 A1 | 11/2005 | Satoyoshi et al. |
| 2005/0276928 A1 | 12/2005 | Okumura et al. |
| 2006/0086319 A1* | 4/2006 | Kasai ....................... C23C 16/16 118/715 |
| 2007/0187363 A1* | 8/2007 | Oka .................. H01J 37/32449 216/59 |
| 2007/0215580 A1 | 9/2007 | Koshiishi et al. |
| 2007/0235136 A1 | 10/2007 | Enomoto et al. |
| 2008/0156631 A1* | 7/2008 | Fair .................. H01J 37/32357 204/164 |
| 2009/0081878 A1* | 3/2009 | Dhindsa ............ H01J 37/32091 438/729 |
| 2010/0041238 A1 | 2/2010 | Cooperberg et al. |

FOREIGN PATENT DOCUMENTS

| | | |
|---|---|---|
| JP | 2004-363552 | 12/2004 |
| JP | 2005-507159 A | 3/2005 |
| JP | 2005-228973 | 8/2005 |
| JP | 2006-253454 | 9/2006 |
| JP | 2007-48748 | 2/2007 |
| JP | 2007-243138 A | 9/2007 |
| JP | 2667-243138 | 9/2007 |
| JP | 2007-266436 | 10/2007 |
| JP | 2007-266534 | 10/2007 |

\* cited by examiner

ELECTRODE FOR PLASMA PROCESSING APPARATUS, PLASMA PROCESSING APPARATUS, PLASMA PROCESSING METHOD AND STORAGE MEDIUM

CROSS REFERENCE TO RELATED APPLICATION

This application is a continuation of Ser. No. 12/379,052, filed Sep. 11, 2009, which is a non-provisional of provisional application U.S. 61/071,556 filed on May 6, 2008, which also claims priority from JP2008-50745 filed Feb. 29, 2008, which all are being incorporated in their entirety herein by reference.

BACKGROUND OF THE INVENTION

Field of the Invention

The present invention relates to an upper electrode, a table (or lower electrode), a plasma processing apparatus including at least one of the upper electrode and table, a plasma processing method and a storage medium, each used for processing a substrate to be processed, such as a semiconductor wafer or the like, to which a plasma process is provided.

Background Art

In a step for manufacturing semiconductor devices, for example, a dry etching process, an aching process and the like has been known, as the plasma process for processing the substrate by changing a processing gas into plasma. In an etching apparatus for performing the dry etching process, for example, a pair of parallel and flat electrodes are vertically arranged to be opposed to each other. By application of high frequency electric power to a space between the two electrodes, the processing gas introduced into the space can be changed into the plasma. As a result, the substrate to be processed, such as the semiconductor wafer (hereinafter referred to as "the wafer") or the like, which is placed on the lower electrode, can be subjected to the etching process. For example, as the etching process, a process for forming recesses in a film formed on the wafer, by using a resist pattern, as a mask, provided on the film to be etched, has been known.

In recent years, a "lower energy and higher density" process, requiring lower ion energy in the plasma and higher electron density, has been widely used in the plasma process. For instance, in the case of etching a silicon film or any other organic film, properly high frequency electric power is generally applied to the electrode provided on a lower side, in order to generate higher density plasma and suppress introduction or capture of ions into the wafer.

In some cases, for the generation of such lower energy and higher density plasma, an extremely high frequency, e.g., 100 MHz, of the high frequency electric power should be required, as compared with the frequency (e.g., approximately several ten MHz) that has been employed so far. However, such an extremely high frequency of the electric power applied to the apparatus may tend to considerably increase intensity of an electric field around a central portion of a surface of the electrode, i.e., a region corresponding to a central portion of the wafer, while relatively decreasing the intensity of the electric field around the periphery of the wafer. Therefore, as shown in FIG. 16, the etching process is progressed at a higher rate around the central portion of the wafer, while exhibiting a significantly lower etching rate around the periphery of the wafer.

To address such problems, Patent Documents 1 and 2 disclose improved etching apparatuses, respectively. Each of these apparatuses is intended for enhancing in-plane uniformity of the plasma process, by embedding a dielectric in a region around the central portion of the upper electrode, such that distribution of the electric field can made uniform by the dielectric. In fact, such an etching apparatus is suitable for providing the plasma process to each wafer having the same layered structure under the same conditions. In some cases, however, the etching process should be provided to different wafers, such as those having different films to be etched and/or different kinds of resist pattern films formed thereon. Additionally, although having the same layered structure, each wafer sometimes has the resist pattern formed thereon with a different shape and/or is sometimes designed to have the recesses each formed in the film while having a different aspect ratio (i.e., a ratio of a depth of the recess relative to a diameter of an opening thereof).

In such a case, the process conditions, such as a kind and/or pressure of each processing gas used, each value of the high frequency electric power and the like, should be controlled, corresponding to a kind or the like of each wafer. Therefore, the state or condition of the plasma should also be changed with such control of the process conditions. Thus, for enhancing the in-plane uniformity of the plasma process, it is necessary to control the distribution of the electric field, corresponding to the process conditions. However, in the etching apparatus having the dielectric provided in the upper electrode as disclosed in the above Patent Documents, the dielectric should be exchanged with another one, such as by disassembling the apparatus, in order to control the distribution of the electric field. This makes it substantially difficult to optionally control the distribution of the electric field, corresponding to the process conditions.

Patent Document 3 describes a technique for controlling a relative permittivity, by providing a control part formed from a dielectric material, between a chamber body and a first electrode. More specifically, the control part has a tank-like structure provided therein, such that a material that can optionally control the relative permittivity can be supplied into the tank-like structure. This configuration is only aimed to control the equivalent relative permittivity, by controlling a degree of electrical connection between the first electrode and the grounded chamber body. Accordingly, this technique cannot solve the above problems in nature.

Patent Document 1: JP2000-323456A (Paragraph [0049], FIG. 4)

Patent Document 2: JP2005-228973A (Paragraphs [0030] to [0033], FIG. 1)

Patent Document 3: JP2007-48748A (Paragraph [0038], FIGS. 3 to 5)

SUMMARY OF THE INVENTION

The present invention was made in light of the above circumstances, and therefore it is an object of this invention to provide a new upper electrode and/or table (or lower electrode), which is used for the plasma processing apparatus and adapted for providing the plasma process to the substrate or wafer with higher in-plane uniformity, by enhancing the in-plane uniformity of the intensity of the electric field of the plasma, with a simple structure, corresponding to the process conditions. Another object of this invention is to provide an improved plasma processing apparatus including at least one of the upper electrode and table related to this invention, a plasma processing method using this plasma processing apparatus, and a storage medium for storing this plasma processing method therein.

The present invention is an electrode for use in a plasma process, wherein the electrode is provided to be opposed to a lower electrode on which a substrate is placed in a processing space, wherein high frequency power is supplied to a space between the electrode and the lower electrode, so as to generate plasma therein and perform the plasma process to the substrate, and wherein the electrode comprises: an electrode plate provided to be opposed to the lower electrode; a support member provided opposite to the lower electrode across the electrode plate, configured for supporting the electrode plate, and having a dielectric injection space formed therein such that a dielectric used for controlling intensity of an electric field in the processing space can be injected into the dielectric injection space; a dielectric supply source connected with the dielectric injection space of the support member via a dielectric supply passage and configured for supplying the dielectric into the dielectric injection space; and a dielectric discharge passage connected with the dielectric injection space of the support member and configured for discharging the dielectric from the dielectric injection space.

In the electrode for use in the plasma process according to the present invention, the dielectric injection space of the support member is provided along a face on the side of the electrode plate of the support member.

In the electrode for use in the plasma process according to the present invention, a member having a gas diffusion space formed therein is provided, the gas diffusion space being connected with a processing gas supply source configured for supplying a processing gas to the substrate, wherein a plurality of gas discharge ports are provided on the electrode plate, each of the gas discharge ports being in communication with the gas diffusion space and configured for injecting the processing gas into the processing space, like a shower.

In the electrode for use in the plasma process according to the present invention, the member having the gas diffusion space formed therein is also used as the electrode plate or used as the support member.

In the electrode for use in the plasma process according to the present invention, the member having the gas diffusion space formed therein is provided between the electrode plate and the support member.

In the electrode for use in the plasma process according to the present invention, the member having the gas diffusion space formed therein is formed from a dielectric having a relative permittivity within a range of 1 to 10.

In the electrode for use in the plasma process according to the present invention, a gas supply member is provided to be projected downward from a central portion of the electrode plate, the gas supply member having a dome-like shape and a plurality of gas discharge apertures formed therein, each of the gas discharge apertures being configured for injecting the processing gas into the processing space.

In the electrode for use in the plasma process according to the present invention, a temperature control mechanism adapted for controlling the temperature of the support member is provided to the support member.

Alternatively, the present invention is an electrode for use in a plasma process, wherein the electrode is provided to be opposed to an upper electrode in a processing space, wherein high frequency power is supplied to a space between the electrode and the upper electrode, so as to generate plasma therein and perform the plasma process to a substrate placed on one face of the electrode, and wherein the electrode comprises: an electrode member provided to be opposed to the upper electrode, a dielectric-injection-space-constituting member having a dielectric injection space formed therein such that a dielectric used for controlling intensity of an electric field in the processing space can be injected into the dielectric injection space; a dielectric supply source connected with the dielectric injection space of the dielectric-injection-space-constituting member via a dielectric supply passage and configured for supplying the dielectric into the dielectric injection space; and a dielectric discharge passage connected with the dielectric injection space and configured for discharging the dielectric from the dielectric injection space.

In the electrode for use in the plasma process according to the present invention, the dielectric injection space is provided in a position corresponding to a central portion of the substrate.

In the electrode for use in the plasma process according to the present invention, the dielectric discharge passage is connected with the dielectric supply source, such that the dielectric can be circulated between the dielectric injection space and the dielectric supply source.

The electrode for use in the plasma process according to the present invention, further comprises a storage unit adapted for storing therein data correlating a kind of each process with an injection amount of the dielectric into the dielectric injection space, and a means adapted for reading the injection amount of the dielectric corresponding to the kind of each selected process from the storage unit then controlling the injection amount of the dielectric.

Alternatively, the present invention is a plasma processing apparatus including an upper electrode, a table constituting a lower electrode, and a processing vessel having a processing space containing the upper electrode and the lower electrode therein, the plasma processing apparatus comprising: a first high frequency power source connected with the lower electrode and used for generating plasma; a gas supply passage configured for supplying a processing gas into the processing vessel; and a vacuum exhaust means adapted for evacuating the interior of the processing vessel, wherein the upper electrode comprises: an electrode plate provided to be opposed to the lower electrode; a support member provided opposite to the lower electrode across the electrode plate, configured for supporting the electrode plate, and having a dielectric injection space formed therein such that a dielectric used for controlling intensity of an electric field in the processing space can be injected into the dielectric injection space; a dielectric supply source connected with the dielectric injection space of the support member via a dielectric supply passage and configured for supplying the dielectric into the dielectric injection space; and a dielectric discharge passage connected with the dielectric injection space of the support member and configured for discharging the dielectric from the dielectric injection space.

Alternatively, the present invention is a plasma processing apparatus including an upper electrode, a table constituting a lower electrode, and a processing vessel having a processing space containing the upper electrode and the lower electrode therein, the plasma processing apparatus comprising: a first high frequency power source connected with the lower electrode and used for generating plasma; a gas supply passage configured for supplying a processing gas into the processing vessel; and a vacuum exhaust means adapted for evacuating the interior of the processing vessel, wherein the lower electrode comprises: an electrode member provided to be opposed to the upper electrode, wherein at least one of the first high frequency power source for generating the plasma and a second high frequency power source for introducing ions present in the plasma is connected with the electrode member; a dielectric-injection-space-constituting member having a dielectric injection space formed therein such that a dielectric used for controlling intensity of an electric field in the processing space can be injected into the dielectric injection space; a dielectric supply source connected with the dielectric injection space of the dielectric-injection-space-constituting member via a dielectric supply passage and configured for supplying the dielectric into the dielectric injection space; and a dielectric discharge passage connected with the dielectric injection space and configured for discharging the dielectric from the dielectric injection space.

Alternatively, the present invention is a plasma processing apparatus including an upper electrode, a table constituting a lower electrode, and a processing vessel having a processing space containing the upper electrode and the lower electrode therein, the plasma processing apparatus comprising: a first high frequency power source connected with either one of the upper electrode and lower electrode and used for generating plasma; a second high frequency power source connected with the lower electrode and used for introducing ions present in the plasma; a gas supply passage configured for supplying a processing gas into the processing vessel; and a vacuum exhaust means adapted for evacuating the interior of the processing vessel into a vacuum state, wherein the upper electrode comprises: an electrode plate provided to be opposed to the lower electrode; a support member provided opposite to the lower electrode across the electrode plate, configured for supporting the electrode plate, and having a dielectric injection space formed therein such that a dielectric used for controlling intensity of an electric field in the processing space can be injected into the dielectric injection space; a dielectric supply source connected with the dielectric injection space of the support member via a dielectric supply passage and configured for supplying the dielectric into the dielectric injection space; and a dielectric discharge passage connected with the dielectric injection space of the support member and configured for discharging the dielectric from the dielectric injection space.

Alternatively, the present invention is a plasma processing apparatus including an upper electrode, a table constituting a lower electrode, and a processing vessel having a processing space containing the upper electrode and the lower electrode therein, the plasma processing apparatus comprising: a first high frequency power source connected with either one of the upper electrode and the lower electrode and used for generating plasma; a second high frequency power source connected with the lower electrode and used for introducing ions present in the plasma; a gas supply passage configured for supplying a processing gas into the processing vessel; and a vacuum exhaust means adapted for evacuating the interior of the processing vessel, wherein the lower electrode comprises: an electrode member provided to be opposed to the upper electrode, a dielectric-injection-space-constituting member having a dielectric injection space formed therein such that a dielectric used for controlling intensity of an electric field in the processing space can be injected into the dielectric injection space; a dielectric supply source connected with the dielectric injection space of the dielectric-injection-space-constituting member via a dielectric supply passage and configured for supplying the dielectric into the dielectric injection space; and a dielectric discharge passage connected with the dielectric injection space and configured for discharging the dielectric from the dielectric injection space.

Alternatively, the present invention is a plasma processing method using a plasma processing apparatus including an upper electrode, a table constituting a lower electrode, a processing vessel configured for containing the upper electrode and the lower electrode therein, and a first high frequency power source connected with the lower electrode and used for generating plasma, wherein the upper electrode and the lower electrode are arranged to be opposed to each other, and wherein the plasma processing method comprises the steps of: supplying a dielectric into a dielectric injection space formed in the upper electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a plasma processing method using a plasma processing apparatus including an upper electrode, a table constituting a lower electrode, a processing vessel configured for containing the upper electrode and the lower electrode therein, a first high frequency power source connected with either one of the upper electrode and the lower electrode and used for generating plasma, and a second high frequency power source connected with the lower electrode and used for introducing ions present in the plasma, wherein the upper electrode and the lower electrode are arranged to be opposed to each other, and wherein the plasma processing method comprises the steps of: supplying a dielectric into a dielectric injection space formed in the upper electrode; placing a substrate on the table; supplying a processing gas into the processing vessel; and changing the processing gas into the plasma between the upper electrode and the lower electrode, so as to provide a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a plasma processing method using a plasma processing apparatus including an upper electrode, a table constituting a lower electrode, a processing vessel configured for containing the upper electrode and the lower electrode therein, and a first high frequency power source connected with the lower electrode and used for generating plasma, wherein the upper electrode and the lower electrode are arranged to be opposed to each other, and wherein the plasma processing method comprises the steps of: supplying a dielectric into a dielectric injection space formed in the lower electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a plasma processing method using a plasma processing apparatus including an upper electrode, a table constituting a lower electrode, a processing vessel configured for containing the upper electrode and the lower electrode therein, a first high frequency power source connected with either one of the upper electrode and the lower electrode and used for generating plasma, and a second high frequency power source connected with the lower electrode and used for introducing ions present in the plasma, wherein the upper electrode and the lower electrode are arranged to be opposed to each other, and wherein the plasma processing method comprises the steps of: supplying a dielectric into a dielectric injection space formed in the lower electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

The plasma processing method according to the present invention further comprises the steps of: reading data correlating a kind of each process with an injection amount of the dielectric into the dielectric injection space, prior to the step of supplying the dielectric; then controlling the injection amount of the dielectric into the dielectric injection space.

Alternatively, the present invention is a storage medium for storing therein a computer program for driving a computer to execute a plasma processing method, wherein the plasma processing method uses a plasma processing apparatus including an upper electrode, a table constituting a lower electrode, a processing vessel configured for containing the upper electrode and the lower electrode therein, and a first high frequency power source connected with the lower electrode and used for generating plasma, wherein the upper electrode and the lower electrode are arranged to be opposed to each other, and wherein the plasma processing method comprises the steps of: supplying a dielectric into a dielectric injection space formed in the upper electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a storage medium for storing therein a computer program for driving a computer to execute a plasma processing method, wherein the plasma processing method uses a plasma processing apparatus including an upper electrode, a table constituting a lower electrode, a processing vessel configured for storing the upper electrode and the lower electrode therein, a first high frequency power source connected with either one of the upper electrode and the lower electrode and used for generating plasma, and a second high frequency power source connected with the lower electrode and used for introducing ions present in the plasma, wherein the upper electrode and the lower electrode are arranged to be opposed to each other, and wherein the plasma processing method comprises the steps of: supplying a dielectric into a dielectric injection space formed in the upper electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a storage medium for storing therein a computer program for driving a computer to execute a plasma processing method, wherein the plasma processing method uses a plasma processing apparatus including an upper electrode, a table constituting a lower electrode, a processing vessel configured for containing the upper electrode and lower electrode therein, and a first high frequency power source connected with the lower electrode and used for generating plasma, wherein the upper electrode and the lower electrode are arranged to be opposed to each other, and wherein the plasma processing method comprises the steps of: supplying a dielectric into a dielectric injection space formed in the lower electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

Alternatively, the present invention is a storage medium for storing therein a computer program for driving a computer to execute a plasma processing method, wherein the plasma processing method uses a plasma processing apparatus including an upper electrode, a table constituting a lower electrode, a processing vessel configured for containing the upper electrode and the lower electrode therein, a first high frequency power source connected with either one of the upper electrode and the lower electrode and used for generating plasma, and a second high frequency power source connected with the lower electrode and used for introducing ions present in the plasma, wherein the upper electrode and the lower electrode are arranged to be opposed to each other, and wherein the plasma processing method comprises the steps of: supplying a dielectric into a dielectric injection space formed in the lower electrode; placing a substrate on the table; supplying a processing gas into the processing vessel; and changing the processing gas into the plasma between the upper electrode and the lower electrode, so as to perform a plasma process to the substrate with the plasma, wherein the step of supplying the dielectric is performed for controlling a supply amount of the dielectric, such that in-plane uniformity of intensity of an electric field of the plasma can be enhanced, as compared with the case in which the dielectric is not supplied into the dielectric injection space.

According to the present invention, with the provision of the dielectric injection space configured for allowing the dielectric to be injected therein, to the upper electrode or table constituting the lower electrode, each used in the plasma processing apparatus, as well as with the provision of the dielectric supply passage and dielectric discharge passage, each being in communication with the dielectric injection space, the dielectric can be controllably supplied into the dielectric injection space. Accordingly, with such control of the amount of the dielectric injected into the dielectric injection space, a capacitor component due to the dielectric injection space can be optionally changed. Thus, in-plane distribution of the intensity of the electric field of the plasma can be controlled with ease, thereby to provide the plasma process with significantly higher in-plane uniformity, corresponding to various process conditions.

DETAILED DESCRIPTION OF THE INVENTION

Figure 1:
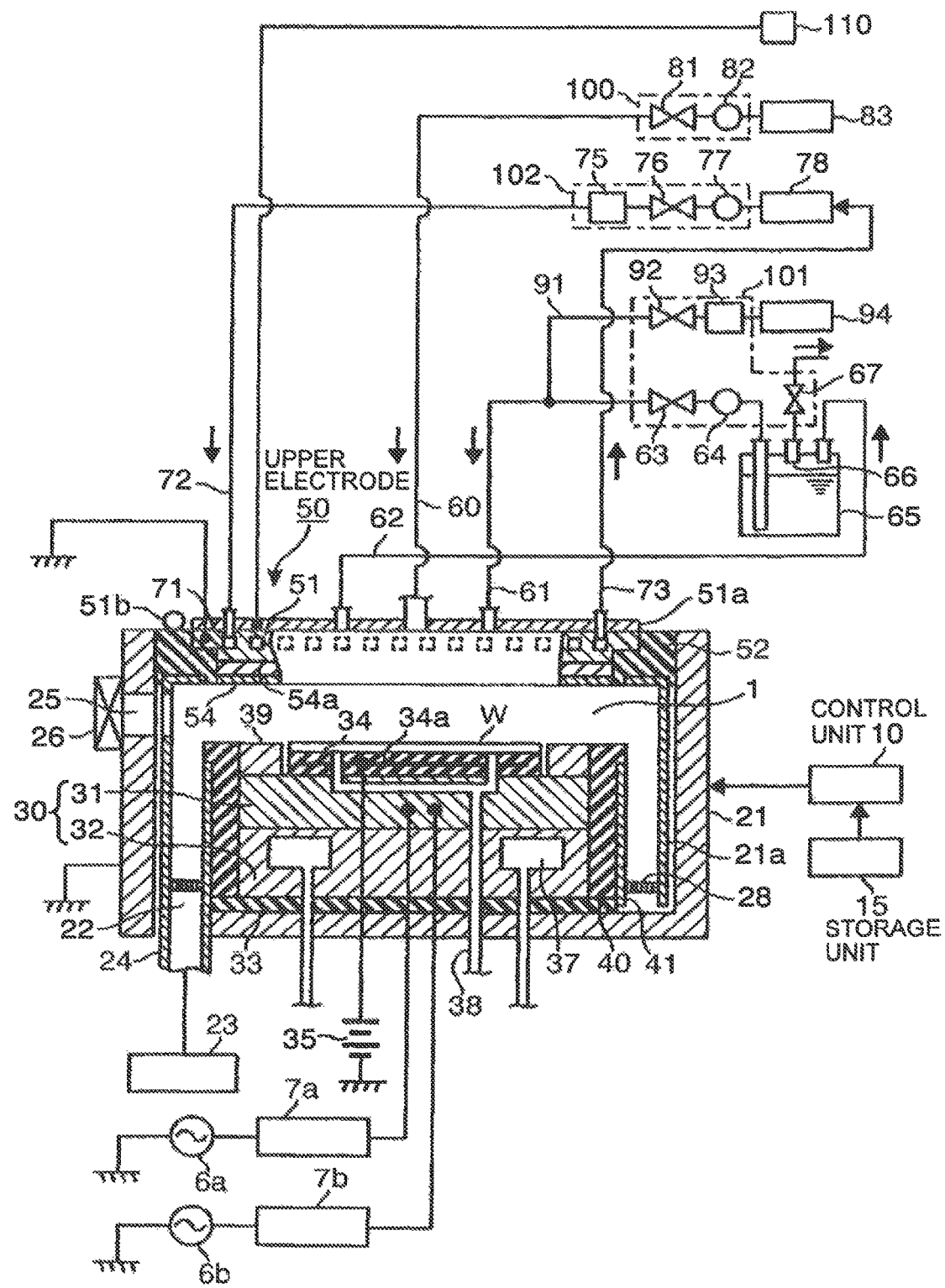
FIG. 1 is a longitudinal side cross section showing one example of an etching apparatus including an upper electrode of the present invention.

Hereinafter, one embodiment will be described with reference to FIG. 1, wherein one exemplary upper electrode related to the present invention is applied to an etching apparatus. FIG. 1 shows one example of the etching apparatus of an RIE (Reactive Ion Etching) type, which is adapted for providing an etching process to a semiconductor wafer (hereinafter referred to as a "wafer") W having, for example, a 300 mm diameter. This etching apparatus includes a processing vessel 21 (e.g., a vacuum chamber having a space hermetically sealed therein) formed of an electrically conductive material, for example, aluminum; a table 30 provided on a central portion of a bottom face of the processing vessel 21; and an upper electrode 50 located above the table 30 while being opposed to the table 30.

An exhaust port 22 is provided through the bottom face of the processing vessel 21, and is communicated with a vacuum exhaust system 23 (or vacuum exhaust means) including a vacuum pump or the like means, via an exhaust pipe 24 provided with a pressure control means (not shown). A transfer port 25 for the wafer W is provided in a wall face of the processing vessel, such that the port 25 can be optically opened and closed by a gate valve 26. In a site (i.e., an inner wall and a top wall of the processing vessel 21) outside a processing space 1 defined between the upper electrode 50 and the table 30 in the processing vessel 21, a covering member 21a is provided for suppressing attachment, to the apparatus, of unwanted by-products that will be generated, such as by etching. It is noted that the processing vessel 21 is grounded.

The table 30 is composed of a lower electrode 31, which serves as an electrode member, and a support member 32 adapted for supporting the lower electrode 31 from below. The table 30 is provided on the bottom face of the processing vessel 21, via an insulating member 33. In addition, the table 30 is covered, around its side face, by a ring member 40. Further, a covering member 41 is provided, around the ring member 40, for suppressing the attachment of the by-products that will be generated, such as by etching.

To an upper portion of the table 30, an electro-static chuck 34 having a plurality of through-holes (not shown) formed therein is provided. In this manner, when some voltage is applied to an electrode film 34a formed in the electro-static chuck 34 from a high-voltage direct-current power source 35, the wafer W will be electro-statically chucked on the table 30.

In the table 30, a temperature control flow passage 37 is formed. This temperature control flow passage 37 is configured for allowing a predetermined temperature control medium to flow therethrough. Thus, the wafer W can be controlled to a desired temperature by the temperature control medium flowed through the temperature control flow passage 37. Additionally, a gas flow passage 38, configured for supplying a heat conducting gas, such as a He (helium) gas or the like, used as a back-side gas, is provided in the table 30. The gas flow passage 38 is opened at several points in a top face of the table 30. The openings of the gas flow passage 38 are respectively communicated with the through-holes formed in the electro-static chuck 34. As such, the back-side gas can be supplied to a rear face or back-side face of the wafer W.

To the lower electrode 31, a first high-frequency power source 6a adapted for supplying first high-frequency power of, for example, 100 MHz, and a second high-frequency power source 6b adapted for supplying second high-frequency power of, for example, 3.2 MHz, which is lower than the frequency of the first high-frequency power source 6a, are connected, via matching circuits 7a, 7b, respectively. The first high-frequency power supplied from the first high-frequency power source 6a is used for changing a processing gas, as will described later, into plasma, while the second high-frequency power supplied from the second high-frequency power source 6b is used for applying bias power to the wafer W so as to introduce ions present in the plasma into a surface of the wafer.

A focus ring 39 is located on an outer periphery of the lower electrode 31, such that the ring 39 surrounds the electro-static chuck 34. Thus, when the plasma is generated, the plasma can be focused on the wafer W placed on the table 30, via the focus ring 39.

Between the covering member 41 located in a lower position of the processing vessel 21 and the inner wall of the processing vessel 21 (or covering member 21a), a baffle plate 28, as a gas distributor for controlling the flow of the processing gas, is provided.

Next, one embodiment of the upper electrode 50 of this invention will be described. The upper electrode 50 includes an electrode plate 54, a support member 51 adapted for supporting the electrode plate 54, and a gas diffusion member 54a located between the electrode plate 54 and the support member 51. In this case, the support member 51, gas diffusion member 54a and electrode plate 54 are layered in this order from the top. The support member 51 is provided to have a bottom-face diameter (i.e., a diameter of a bottom face thereof) slightly larger, for example, by approximately 10 mm, than the diameter of the wafer W, and is formed from electrically conductive aluminum. The upper electrode 50 is circumferentially supported by the top wall of the processing vessel 21 via an insulating member 52.

Figure 2:
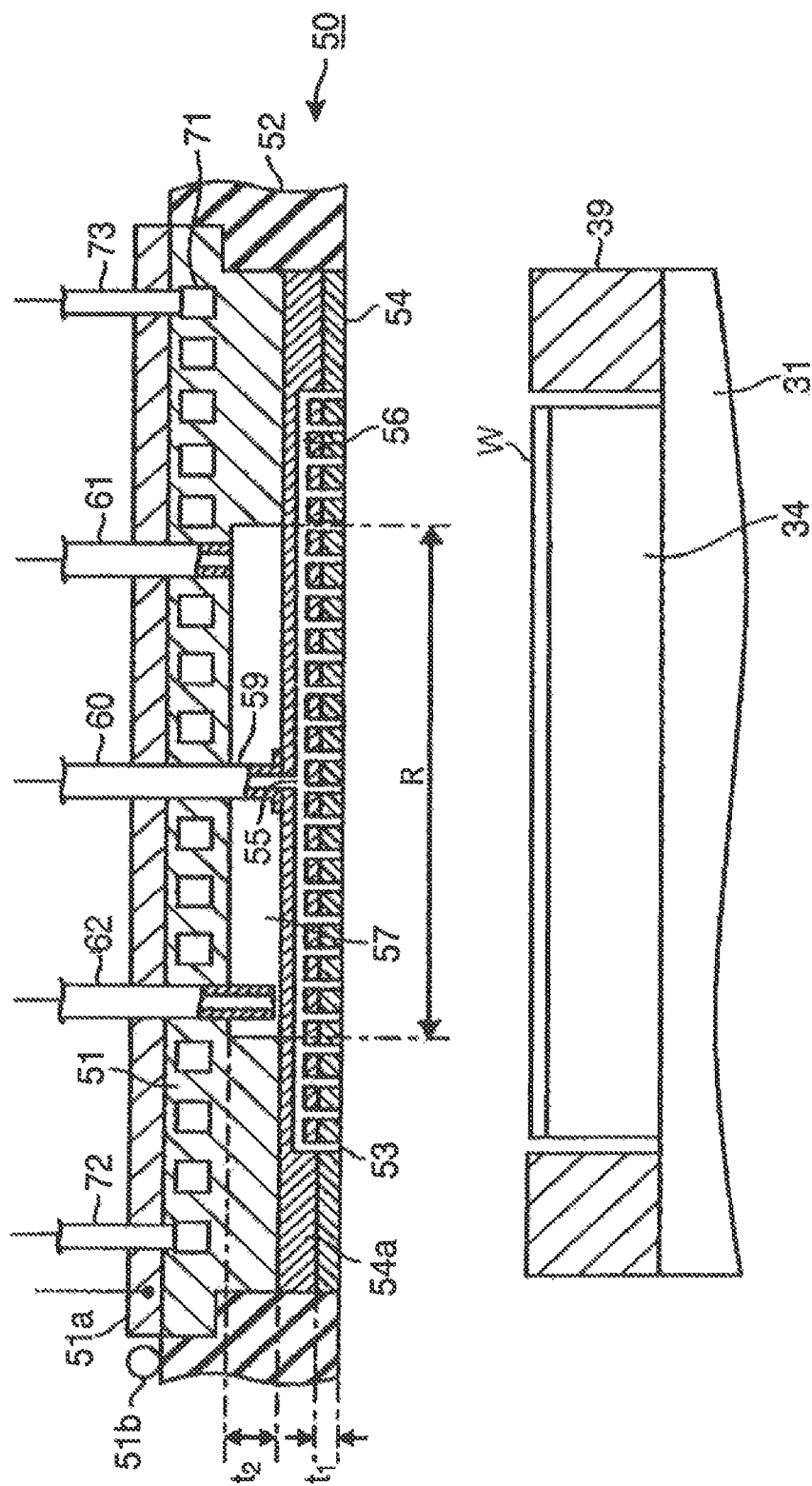
FIG. 2 is a longitudinal side cross section showing one example of the upper electrode.

As shown in FIG. 2, the gas diffusion member 54a is formed to have the same diameter as the bottom-face diameter of the support member 51, and has a gas supply port 55 provided in a central position of a top face thereof. In the gas diffusion member 54a, a gas diffusion passage 56, i.e., a horizontally extending space for diffusing a gas, is provided to be in communication with the gas supply port 55. The gas diffusion member 54a is formed from, for example, a metal having higher electrical resistance, or from a dielectric, such as a PTFE (polytetrafluoroethylene) resin or the like, having a relative permittivity within a range of from 1 to 10.

The electrode plate 54 is formed from, for example, silicon, and has a plurality of gas discharge ports 53 formed in its bottom face. Each of the gas discharge ports 53 is configured for supplying the processing gas into the processing space 1, like a shower, and is in communication with the gas diffusion passage 56. The electrode plate 54 is formed to have the same diameter as the bottom-face diameter of the support member 51, and has a thickness t1 of, for example, 5 mm, and resistivity of 0.5 $\Omega$m at 25° C.

Figure 3:
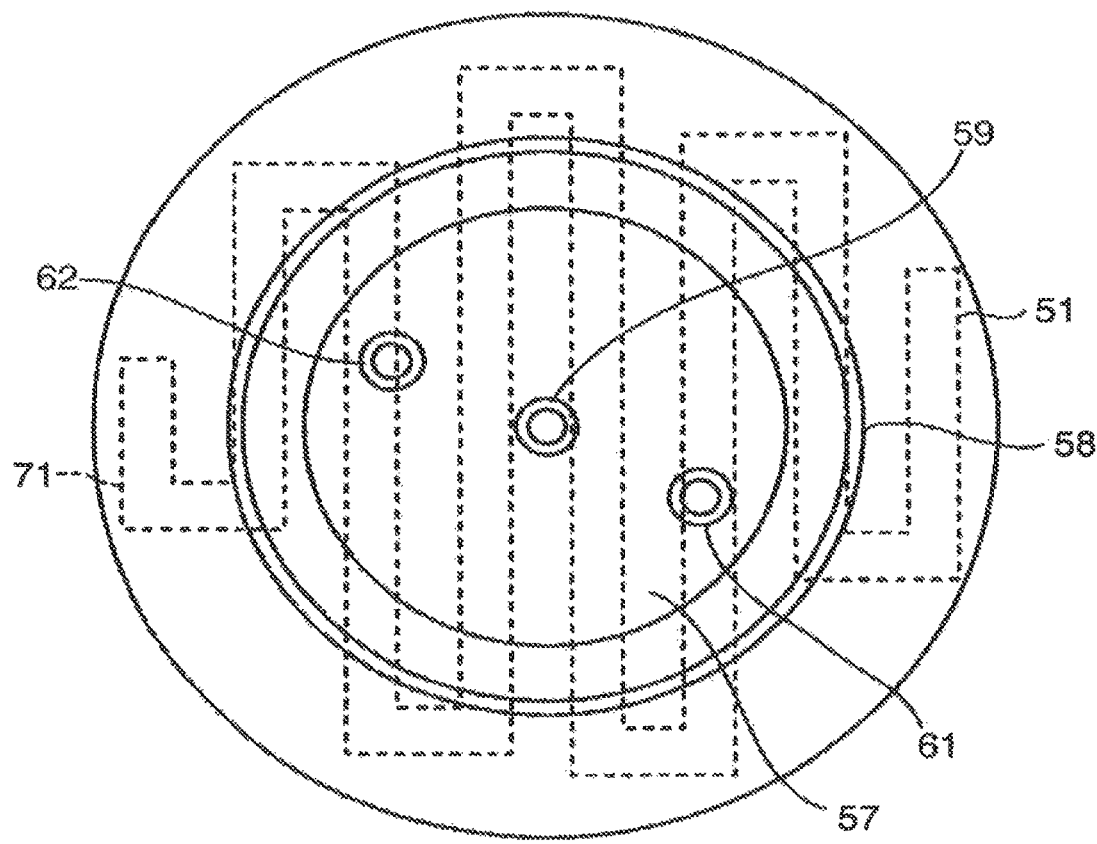
FIG. 3 is a plan view of the upper electrode when it is seen from below.

As shown in FIGS. 2 and 3, a recess 57, having a diameter R of, for example, 160 mm and a depth t2 of, for example, 5 mm, is formed in a central portion of the bottom face of the support member 51. The recess 57 serves as a dielectric injection space for storing the dielectric therein, as will be described below, and is located in a position corresponding to a central portion of the wafer W. While not shown in FIGS. 1 and 2, a sealing member 58 is provided at the bottom face of the support member 51 around the recess 57, wherein the sealing member 58 is fit in a ring-like groove. With such configuration, when the electrode plate 54 and support member 51 are firmly contacted together, by pressure, due to a fixing means, such as by using bolts or the like (not shown), the recess 57 will be kept in a hermetically sealed state.

Additionally, a gas supply pipe 59 is provided in the central portion of the support member 51. The gas supply pipe 59 constitutes a gas flow passage vertically extending through the support member 51. The gas supply pipe 59 extends, at its lower end portion, through the recess 57, and is airtightly connected with the gas supply port 55 on the top face of the gas diffusion member 54a. Accordingly, the recess 57 is airtightly separated from the gas supply pipe 59 and processing space 1.

A top end of the gas supply pipe 59 is connected with a gas supply pipe 60 constituting a gas supply passage provided in the top face of the support member 51. To an upstream end of the gas supply pipe 60, a processing gas supply source 83 storing therein the processing gas used for etching is connected, via a gas supply system 100 including a valve 81 and a flow-rate controller 82. While not shown in the drawings, a plurality of processing gas supply sources are connected with the processing gas supply source 83, via, for example, a plurality of branch passages, valves and/or flow-rate controllers. As such, suitable processing gases can be switched, corresponding to a kind of each wafer W that will be subjected to the process.

Furthermore, a dielectric supply passage 61 and a dielectric discharge passage 62, both connected with a top face (or face opposed to the gas diffusion member 54a) of the recess 57, are provided in the support member 51, such that the two passages 61, 62 can be in communication with the recess 57, respectively. The dielectric supply passage 61 is opened at a level of the top face of the recess 57, while the dielectric discharge passage 62 is opened in the recess 57, in a position adjacent to the gas diffusion member 54a. To an upstream end of the dielectric supply passage 61, a dielectric supply source 65 is connected, via a valve 63 and a liquid feeding means 64, such as a rotary pump or the like. In the dielectric supply source 65, a dielectric is stored, which is a liquid having a relative permittivity of approximately 1.9, such as a fluorine-containing inert liquid ($C_6F_{14}$). The dielectric supply passage 61 is also opened in the dielectric supply source 65 in a position adjacent to a bottom face thereof.

To a portion of the dielectric supply passage 61 extending downstream (or on the side of the support member 51) relative to the valve 63, one end of a discharge gas supply passage 91 is connected. The discharge gas supply passage 91 is configured for supplying, for example, a nitrogen gas, into the recess 57, via the dielectric supply passage 61, so as to discharge the dielectric stored in the recess 57 to the outside, via the dielectric discharge passage 62, by pressure of the nitrogen gas. Meanwhile, the other end of the discharge gas supply passage 91 is connected with a discharge gas supply source 94 storing, for example, the nitrogen gas, therein, via a valve 92 and a flow-rate controller 93. To a downstream end (or one end opposite to the recess 57) of the dielectric discharge passage 62, the dielectric supply source 65 is connected. Thus, the dielectric stored in the recess 57 can be returned into the dielectric supply source 65, via the dielectric discharge passage 62. To a top face of the dielectric supply source 65, a gas exhaust pipe 66, configured for discharging a gas present in the dielectric supply source 65 to the outside, is connected. When the dielectric and/or nitrogen gas is supplied into the recess 57, the nitrogen gas that has been supplied into the dielectric supply source 65 via the dielectric discharge passage 62 is discharged, by opening the valve 67 provided to the gas exhaust pipe 66. These valves 63, 67, 92, liquid feeding means 64 and flow-rate controller 93 constitute, together, a dielectric supply system 101.

Above the recess 57 in the support member 51, a temperature control flow passage 71, which serves as a part of a temperature control mechanism, has a snake-like shape, and extends in a horizontal direction, as shown in FIG. 3. To both ends of the temperature control flow passage 71, a temperature-control-medium supply passage 72 and a temperature-control-medium discharge passage 73, both extending through the top face of the support member 51, are connected, respectively. To an upstream end of the temperature-control-medium supply passage 72, as shown in FIG. 1, a temperature-control-medium supply source 78 is connected, via a temperature controller 75, such as a heater, a chiller and the like, a valve 76, and a liquid feeding means 77 including a flow rate controller. Thus, the temperature of the electrode plate 54 can be controlled within a predetermined range of, for example, 60° C. to 200° C., with a temperature control medium controlled within such a predetermined temperature range of, for example, 60° C. to 200° C. and flowed through the support member 51. The temperature-control-medium supply source 78 is also connected with a downstream end (or discharge side end) of the temperature-control-medium discharge passage 73. Thus, the temperature control medium can be circulated by the liquid feeding means 77. In this case, the temperature controller 75, valve 76 and liquid feeding means 77 constitute, together, a temperature-control-medium supply system 102.

Additionally, in the top face of the support member 51, a heater 51*a* connected with a power source 110 is provided as a part of the temperature control mechanism. The heater 51*a* is adapted for heating the electrode plate 54 up to, for example, 60° C. to 200° C., via the support member 51 and gas diffusion member 54*a*. On a top face of the insulating member 52 beside the heater 51*a*, a temperature detection means 51*b*, such as a thermocouple or the like, is provided. Thus, the temperature of the central portion of the bottom face of the electrode plate 54 can be measured, indirectly, based on a temperature detected on the top face of the insulating member 52. With such detection of the temperature of the electrode plate 54 by the temperature detection means 51*b*, a control unit 10, as will be described later, can control the temperature of the electrode plate 54, by controlling the temperature of the heater 51*a* as well as by controlling the temperature and flow rate of the temperature control medium flowed through the temperature control flow passage 71. It is noted that the support member 51 is grounded, and that FIG. 3 shows the support member 51 when it is seen from below.

Figure 4:
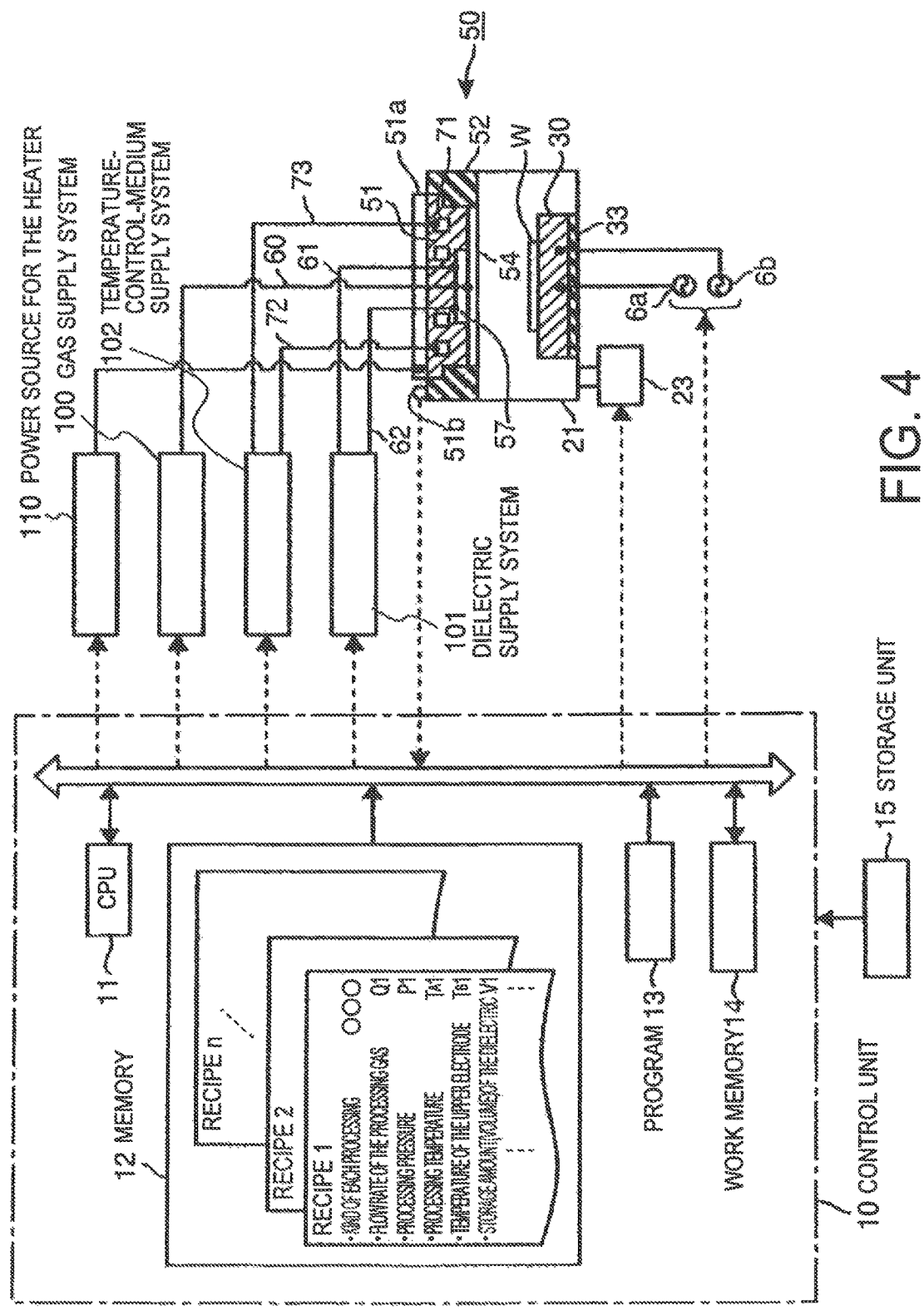
FIG. 4 is a schematic diagram showing one example of a control unit related to the etching apparatus.

This etching apparatus includes, as shown in FIG. 4, the control unit 10 composed of, for example, a computer, as a means for controlling an injection amount of the dielectric after reading the injection amount. The control unit 10 includes a data processing unit or the like, which is composed of a CPU 11, a memory 12, a program 13 and a work memory 14 for the working. The memory 12 has storage regions respectively provided for a kind of each process (recipe). Namely, in each of the storage regions of the memory 12, values of the processing conditions for each process, including a kind of each processing gas, a processing pressure, a processing temperature, a processing time, a gas flow rate, a frequency and power of the high frequency power and the like; and data, such as the amount (volume) of the dielectric supplied into the recess 57, temperature of the electrode plate 54 and the like, are written, respectively. In this case, the amount (volume) of the dielectric and the temperature of the electrode plate 54 have been obtained, in advance, for example, by experiments and/or calculations, such that the in-plane uniformity of the electric field of the plasma (or electron density) can be adequately applicable to a selected process, upon changing the processing gas into the plasma under the above processing conditions, and such that a capacitor component due to the recess 57 and resistance (or resistivity) of the electrode plate 54 can be set at predetermined values, respectively. More specifically, the amount of the dielectric in the recess 57 and the temperature of the electrode plate 54, for rendering the in-plane uniformity of the electric field of the plasma applicable or preferable, can be obtained for the following reasons.

Assuming that electrical capacitance of the capacitor component provided by the recess 57, the relative permittivity of the dielectric constituting the capacitor, an area of the electrode also constituting the capacitor and a thickness of the dielectric constituting the capacitor are expressed by C, ε, S, d, respectively, the following relation can be obtained, $$C = \varepsilon(S/d) \tag{1}$$

In this relational expression (1), the thickness d can be controlled, by controlling the amount of the dielectric supplied into the recess 57. As a result, the capacitance C of the capacitor component due to the recess 57 can be changed.

For instance, when the capacitance C of the capacitor component due to the recess 57 is decreased, impedance between the upper electrode 50 and the table 30 will be increased. Thus, apparent high frequency power supplied into the processing space 1 will be decreased, as such reducing the intensity of the electric field of the plasma. Contrary, when the capacitance C of the capacitor component due to the recess 57 is increased, the impedance between the upper electrode 50 and the table 30 will be decreased. Thus, the intensity of the electric field of the plasma will be increased. Therefore, by controlling the capacitance C of the capacitor component due to the recess 57, corresponding to the in-plane distribution of the electric field of the plasma, or by reducing the capacitance C of the capacitor component by injecting the dielectric into the recess 57, in a region of higher intensity of the electric field of the plasma (or central region of the wafer W), the in-plane uniformity of the plasma can be positively enhanced.

Further, assuming that a skin depth of the electrode plate 54 relative to the high frequency power supplied from the first high-frequency power source 6*a*, the frequency of the high frequency power supplied from the first high-frequency power source 6*a*, magnetic permeability of the electrode plate 54, resistivity of the electrode plate 54 and the ratio of the circumference of a circle to its diameter are expressed by δ, f, μ, ρ, π, respectively, the following relation can be established.

$$\delta = (2/\omega\mu\sigma)^{1/2}, \ \omega = 2\pi f, \ \sigma = 1/\rho \tag{2}$$

Therefore, by controlling the temperature of the electrode plate 54, the value ρ in this relation (2) can be controlled. Thus, with such control of the temperature of the electrode plate 54, an effect of the plasma due to the recess 57 can be changed, thereby controlling the distribution of the electric field.

Namely, this embodiment is intended to control the amount of the dielectric supplied into the recess 57 as well as the temperature of the electrode plate 54. It should be appreciated that each processing parameter may be calculated each time a selected process is performed, without storing the amount of the dielectric supplied into the recess 57 and temperature of the electrode plate 54, in advance, in the memory 12.

The program 13 incorporates instructions, each provided for sending a control signal to each part or unit of the etching apparatus from the control unit 10, so as to drive the part or unit to carry out each step as will be described later, thereby performing a necessary process or transfer operation for the wafer W. Additionally, the program 13 incorporates other instructions, respectively provided for controlling the liquid feeding means 64, 77, valves 63, 67, 92 and flow-rate controller 93, so as to achieve the amount of the dielectric and temperature of the electrode plate 54 written in the above memory 12. When each instruction of the program 13 is executed by the CPU 11, the processing conditions are read by the work memory 14, and the control signal (or signals) corresponding to the conditions is then sent to each part or unit of the etching apparatus. The program 13 (including a program related to input and/or display operations of the processing conditions) is first stored in a storage unit 15, i.e., a computer storage medium, such as a flexible disk, a compact disk, an MO (or magneto-optical disk) or the like, and is then installed into the control unit 10.

Figure 5:
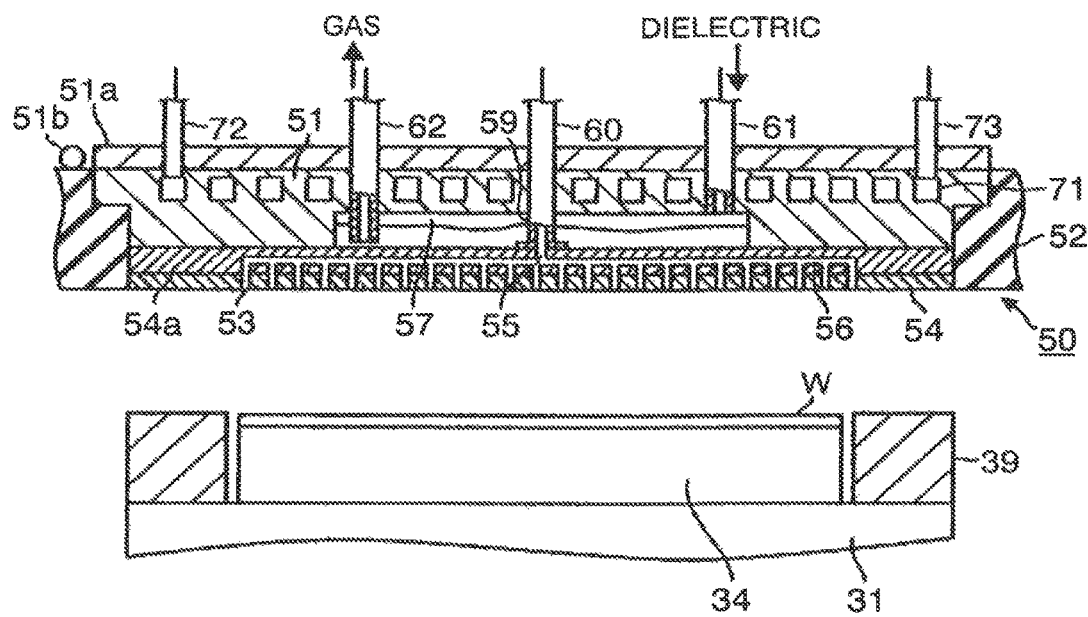
FIG. 5 is a schematic diagram showing one exemplary operation of the etching apparatus.
Figure 6:
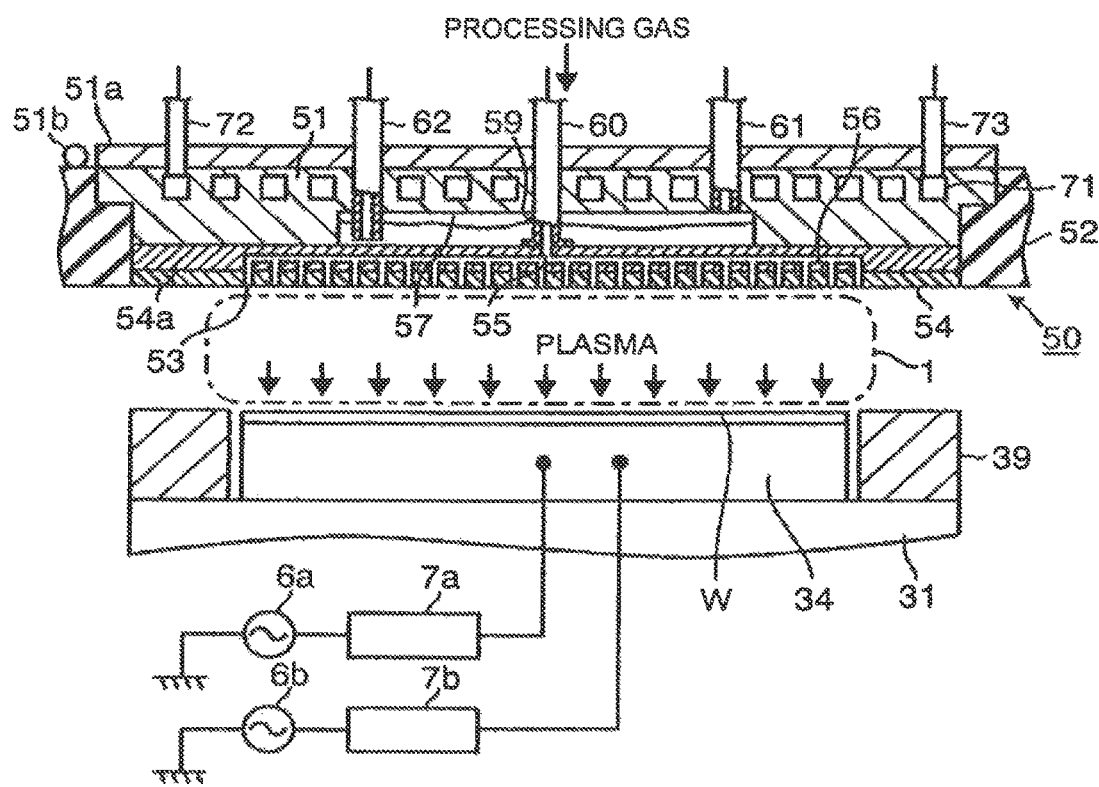
FIG. 6 is a schematic diagram showing another example of the operation of the etching apparatus.

Next, an operation of the etching apparatus will be described, with reference to FIGS. 5 and 6. First, a recipe of the process that is about to be performed is selected, and the process conditions corresponding to the selected recipe are then read by the work memory 14 from the memory 12. Thereafter, as shown in FIG. 5, the valves 63, 67 are opened, while the liquid feeding means 64 is actuated to supply the dielectric into the recess 57 from the dielectric supply source 65, such that the amount of the dielectric in the recess 57 will correspond to the processing conditions. As the dielectric is filled in the recess 57, an ambient gas, for example, a nitrogen gas, filled in advance in the recess 57, is purged by the dielectric toward the dielectric supply source 65 via the dielectric discharge passage 62. Eventually, the nitrogen gas is discharged to the outside of the etching apparatus via the gas exhaust passage 66. Simultaneously, the temperature control medium is flowed through the temperature control flow passage 71 by the liquid feeding means 77, while the heater 51a is turned on. Thus, the temperature of the electrode plate 54 can be controlled at a predetermined temperature, for example, 90° C.

Then, the gate valve 26 is opened, and the wafer W is carried into the processing vessel 21 by a carrier means (not shown), and placed on the table 30. On the surface of the wafer W, for example, a silicon oxide film (not shown) is formed. In addition, a patterned resist mask (not shown) is layered on the silicon oxide film. Thereafter, the wafer W is chucked by the electro-static chuck 34, while the flow rates of the temperature control medium and heat conducting gas, respectively flowed through the temperature control flow passage 37 and gas flow passage 38, are controlled, respectively, to adjust the temperature of the wafer W at, for example, 30° C. Subsequently, the processing gas, for example, $C_4F_8/A_r/O_2$, of a predetermined flow rate is supplied into the processing vessel 21, while the throughput of the vacuum exhaust system 23 is controlled to set the interior of the processing vessel 21 at a desired degree of vacuum.

Figure 16:
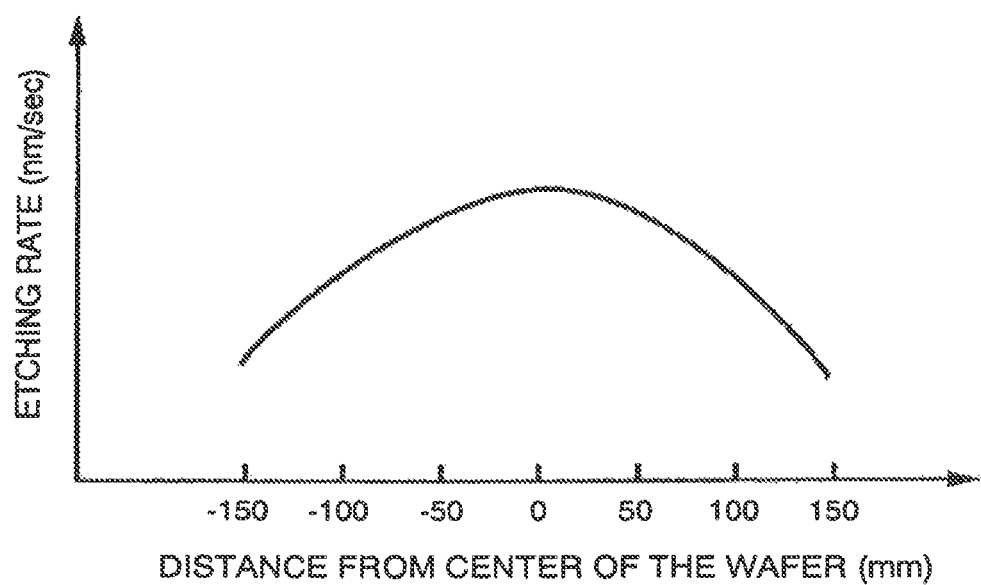
FIG. 16 is a schematic diagram showing a state of plasma in one conventional etching apparatus.

Thereafter, predetermined high frequency power is supplied to the table 30 from the first high-frequency power source 6a and second high-frequency power source 6b, respectively, so as to change the processing gas into the plasma as well as to introduce the ions present in the plasma into the wafer W. At this time, if the recess 57 (or dielectric) is not provided in the upper electrode 50, the etching process would be progressed at a higher speed around the central portion of the wafer W, as shown in FIG. 16, while the etching rate would be significantly lowered around the periphery of the wafer W, as compared with the central portion. However, by using the upper electrode 50 of this embodiment, the amount of the dielectric in the recess 57 and the temperature of the electrode plate 54 can be optionally controlled as described above. Therefore, the intensity of the electric field (or electron density) around the central portion of the wafer W can be adequately decreased. Thus, as shown in FIG. 6, the intensity of the electric field of the plasma can be substantially uniformed in the Surface of the wafer W, thereby rendering the etching rate adequately uniform in the surface. It is noted that arrows depicted, in the plasma shown in FIG. 6 schematically express the intensity of the electric field of the plasma, respectively.

Once the etching process is completed, the supply of the high frequency power is stopped, and the supply of the processing gas is also stopped. Thereafter, the processing vessel 21 is evacuated, and the wafer W is then carried out from the processing vessel 21. Then, in the case of further providing a desired process to another wafer W that will be processed under different conditions, the amount of the dielectric in the recess 57 and the temperature of the electrode plate 54 are newly controlled, corresponding to a new recipe, via the dielectric supply system 101 and temperature-control-medium supply system 102, in the same manner as described above. In this case, if the amount of the dielectric in the recess 57 is required to be increased, the valves 63, 67 are respectively opened, so that the dielectric can be further supplied into the recess 57 by the liquid feeding means 64. Contrary, if the amount of the dielectric in the recess 57 is needed to be decreased, the valve 63 is closed while the valves 67, 92 are respectively opened, so that the nitrogen gas can be supplied into the recess 57 from the discharge gas supply source 94. Consequently, the dielectric in the recess 57 can be discharged toward the discharge supply source 65 via the dielectric discharge passage 62.

According to this embodiment, by providing the recess 57 in the support member 51 as well as the provision of the dielectric supply passage 61 and dielectric discharge passage 62 both communicated with the recess 57, the dielectric can be controllably supplied into the recess 57. Additionally, the in-plane distribution of the intensity of the electric field of the plasma that will be changed, corresponding to the process conditions, such as the kind of each wafer W (e.g., the composition of the film to be etched and/or mask), kind of each processing gas and/or gas pressure, is obtained in advance, by experiments and/or calculations. Therefore the amount of the dielectric in the recess 57 can be optionally controlled to render the in-plane distribution of the intensity of the electric field of the plasma substantially uniformed. Thus, the in-plane distribution of the intensity of the electric field of the plasma generated from the processing gas can be uniformed with ease, as such providing the etching process with higher in-plane uniformity, corresponding to various processing conditions. Moreover, in addition to the control of the amount of the dielectric in the recess 57, the resistance (or resistivity) of the electrode plate 54 can be adequately controlled, by controlling the temperature of the electrode plate 54. Therefore, as is also demonstrated in several examples discussed below, the in-plane distribution of the intensity of the electric field of the plasma can be finely controlled.

Because the electrode plate 54 (and/or gas diffusion member 54a) is provided to cover the bottom face of the support member 51, the recess 57 formed in the support member 51, including a face joined to the electrode plate 54, is not exposed to the processing space 1. Thus, occurrence of unwanted particles from each face of the recess 57 can be suppressed or substantially eliminated.

In the above example, the diameter R of the recess 57 is 160 mm, and the depth t2 thereof is 5 mm. However, as seen in the examples discussed below, the diameter R may be changed within a range of approximately 100 to 300 mm, while the thickness t2 may be set within a range of approximately 5 to 10 mm. Additionally, in the above example, the amount of the dielectric in the recess 57 and the temperature of the electrode plate 54 are controlled or changed together. However, only the amount of the dielectric supplied into the recess 57 may be controlled, without any control of the temperature of the electrode plate 54. As the material for the electrode plate 54, for example, carbon or the like material other than silicon can be used.

Figure 7:
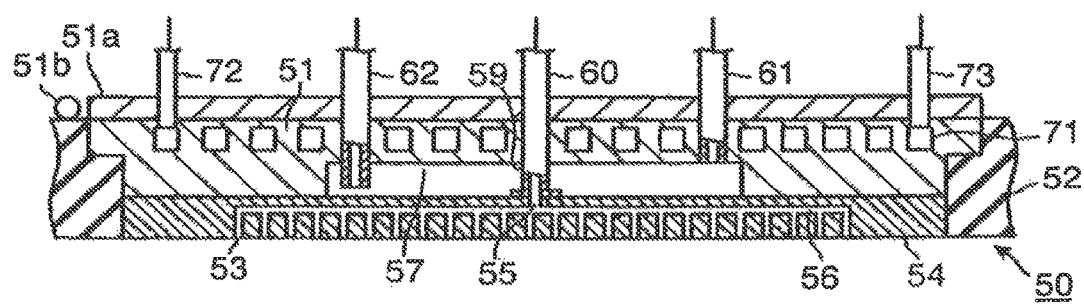
FIG. 7 is a longitudinal side cross section showing another example of the upper electrode of the present invention.
Figure 8:
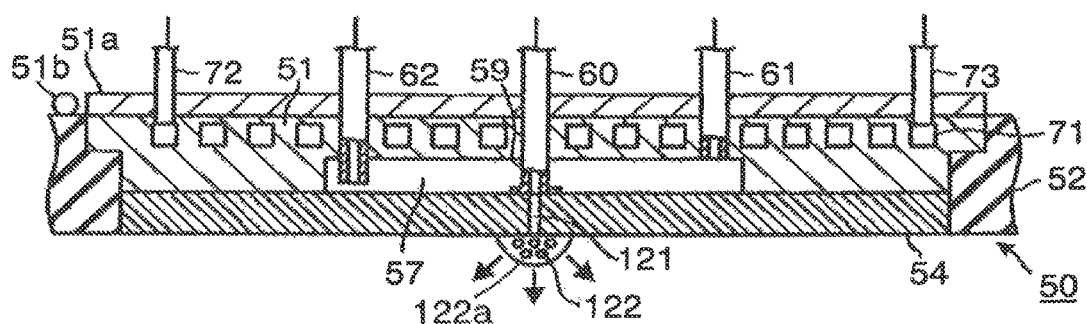
FIG. 8 is a longitudinal side cross section showing still another example of the upper electrode of the present invention.

In the above example, the gas diffusion passage 56 configured for diffusing the processing gas into the gas diffusion member 54a is provided. However, the electrode plate 54 may be modified as shown in FIG. 7. Furthermore, as shown in FIG. 8, the gas diffusion member 54a may be eliminated. Instead, the electrode plate 54 may be directly contacted with the support member 51. In this case, a gas introduction passage 121, extending through the electrode plate 54 while being in communication with the gas supply pipe 59, may be provided in the electrode plate 54. Additionally, as shown in FIG. 8, a gas supply member 122a, having a downwardly convex dome-like shape and a plurality of apertures formed therein, may be provided on the bottom face of the electrode plate 54, such that the gas supply member 122a can be in communication with the gas introduction passage 121. In this manner, the processing gas can be radially supplied onto the wafer W from the gas injection ports 122 of the dome-like gas supply member 122a. With such configuration, a similar effect to the above example can also be obtained. It is noted that the recess 57 may be completely surrounded by the support member 51.

Figure 9:
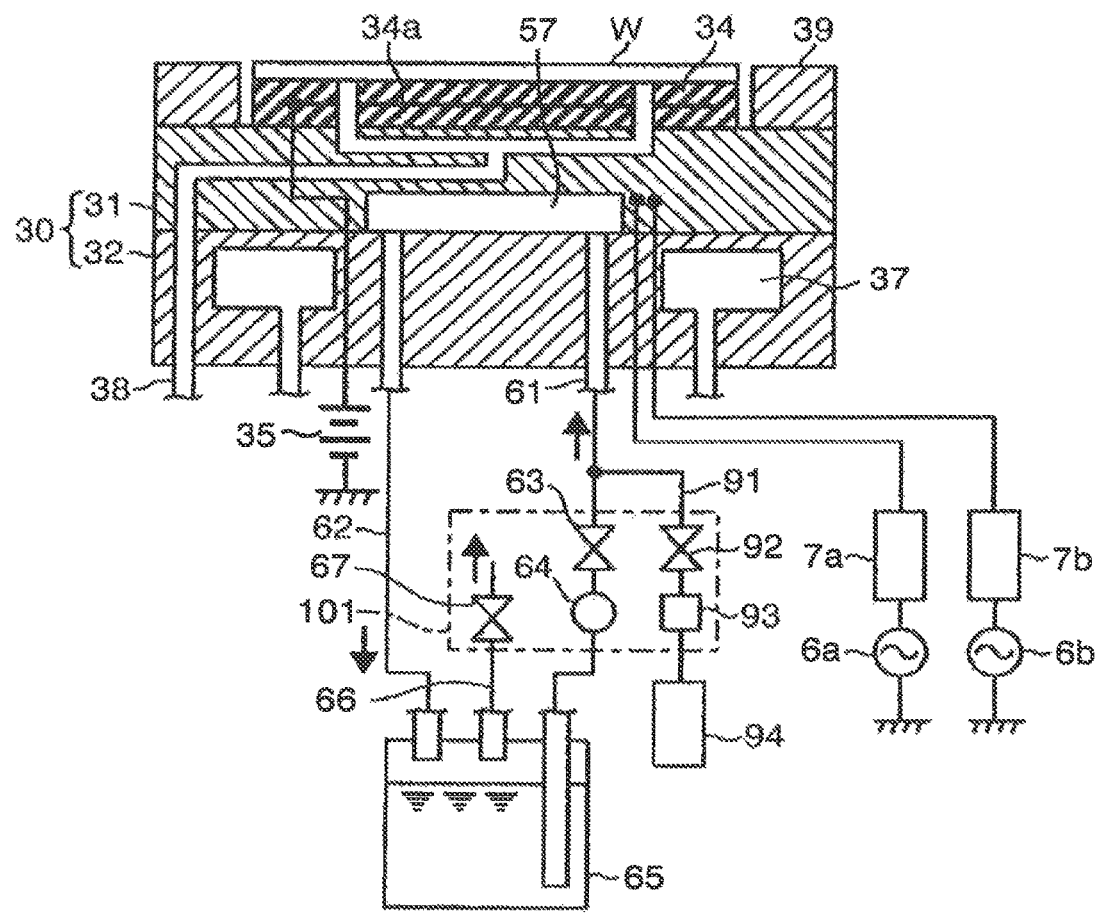
FIG. 9 is a longitudinal side cross section showing one example in which a recess is provided in a table, rather than provided in the upper electrode.

Unlike the table 30 in which the electro-static chuck 34, temperature control flow passage 37 or gas flow passage 38 are provided as described above, the recess 57 is provided in the support member 51, with pipes and wirings arranged in significantly reduced numbers, as compared with the table 30. Therefore, such a recess 57 can be formed easily. However, as shown in FIG. 9, the recess 57 may be provided in the table 30 (or lower electrode 31). In such a case, the lower electrode 31 serves as a dielectric-injection-space-constituting member. In FIG. 9, the recess 57 is located more adjacent the wafer W than that in the above example. Therefore, the intensity of the electric field of the plasma can be further uniformed due to the dielectric, thereby to provide the etching process with much higher in-plane uniformity. In this case, the thickness of the electrode of the electro static chuck 34 is set at, for example, 20 mm or less. Additionally, in FIG. 9, the same parts described in the above example are designated by the same reference numerals. Furthermore, the recess 57 may be provided in both of the support member 51 and table 30. While the processing gas is supplied onto the wafer W from the upper electrode 50 in the above example, the supply manner of the processing gas is not limited to this manner. For instance, the gas supply pipe 60 may be provided laterally to the wafer W.

In the above example, the fluorine-containing inert liquid having a relative permittivity of 1.9 is used as the dielectric supplied into the recess 57. However, other CF-type polymers or CHF-type polymers (e.g., CFC-type liquids non-volatile at a normal temperature) having a relative permittivity within a range of approximately 1 to 3 may also be used. Alternatively, as the dielectric, powder formed from ceramics, e.g., $Al_2O_3$, having a relative permittivity of approximately 1 to 20, $S_1O_2$ (or glass wool) having a relative permittivity of approximately 1 to 4 (or 1 to 7), powder of a resin, e.g., PTFE, having a relative permittivity of approximately 2, and a nitrogen ($N_2$) gas having a relative permittivity of approximately 1 may be used. Alternatively, the interior of the recess 57 may be brought into a vacuum state ($\varepsilon$: 1), by suitably providing a valve, a flow-rate controller and a vacuum pump (not shown) to the dielectric discharge passage 62. Additionally, the above dielectrics may be used in a mixed state.

Alternatively or additionally, several storage tanks may be provided for storing therein each of such dielectrics as mentioned above, so that the kind of each dielectric supplied into the recess 57 can be changed, corresponding to the various processing conditions. In this case, the value $\varepsilon$ in the above relation can also be controlled. Thus, the distribution of the intensity of the electric field can be controlled in a greater range than in the above example. Furthermore, in the above example, the dielectric can be circulated between the recess 57 and the dielectric supply source 65 via the dielectric discharge passage 62. However, in the case of using the aforementioned gas as the dielectric, such a gas may be discharged to the outside via the dielectric discharge passage 62, without being circulated in the system.

In the above example, the amount of the dielectric injected into the recess 57 is controlled for each recipe. However, for example, in such a case in which the in-plane distribution of the intensity of the electric field of the plasma is changed during a certain process provided to the wafer W, the amount of the dielectric may be controlled during the process, in response to the change.

As described above, one method for controlling the relative permittivity of the upper electrode 50 has been discussed, with respect to the case in which the intensity of the electric field of the plasma around the central region of the wafer W is relatively increased, by way of example. This invention can also be applied to the case in which the intensity of the electric field of the plasma in the central region of the wafer W is relatively lowered. In such a case, the dielectric having a relatively high relative permittivity may be supplied into the recess 57, or otherwise the temperature of the electrode plate 54 may be lowered. Alternatively, as described above, both of the amount of the dielectric in the recess 57 and the temperature of the electrode plate 54 may be controlled at the same time.

Figure 10:
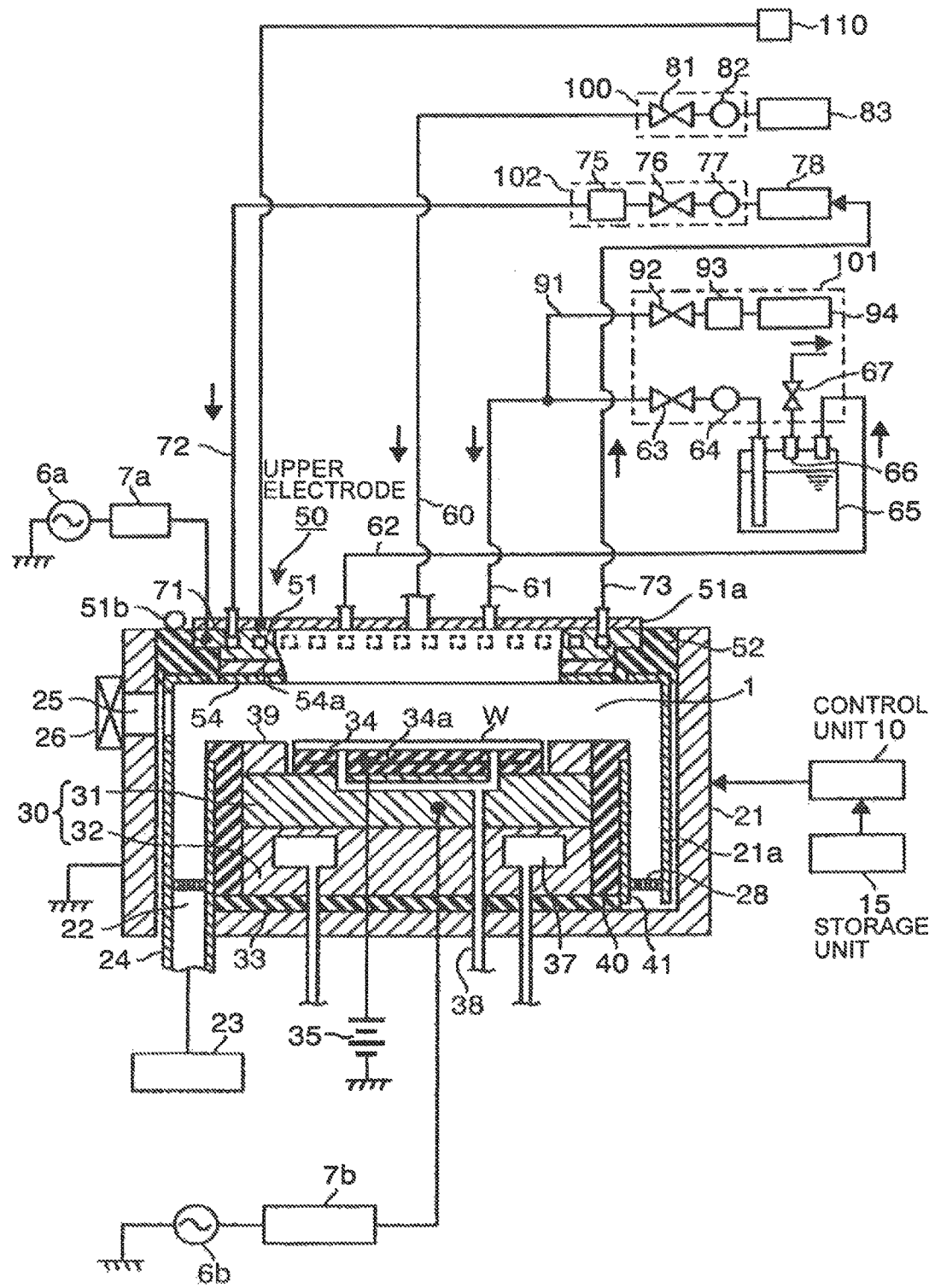
FIG. 10 is a longitudinal side cross section showing another example of the etching apparatus.
Figure 11:
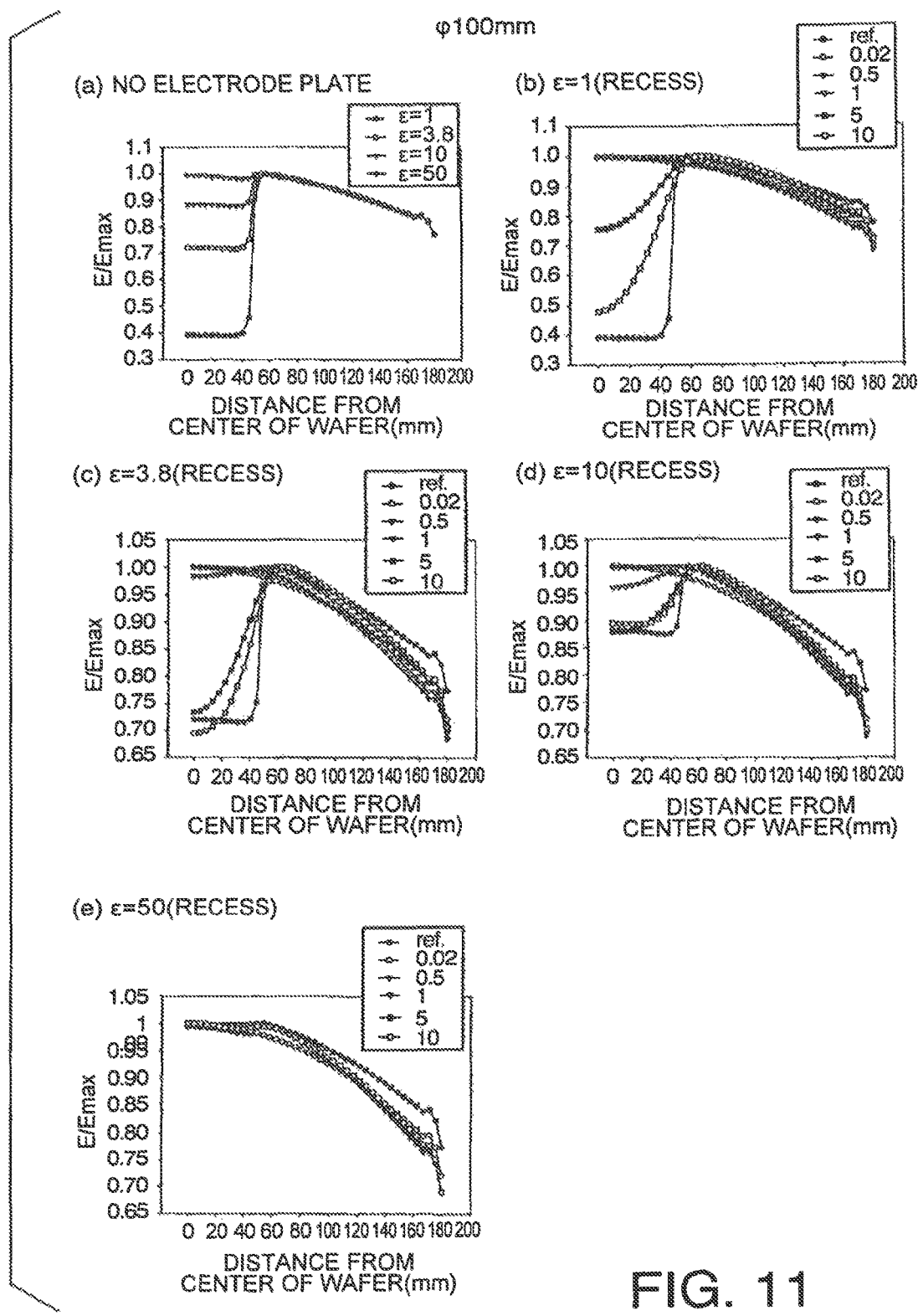
FIGS. 11(a) through 11(e) illustrate profiles, respectively showing results related to examples of the present invention.
Figure 12:
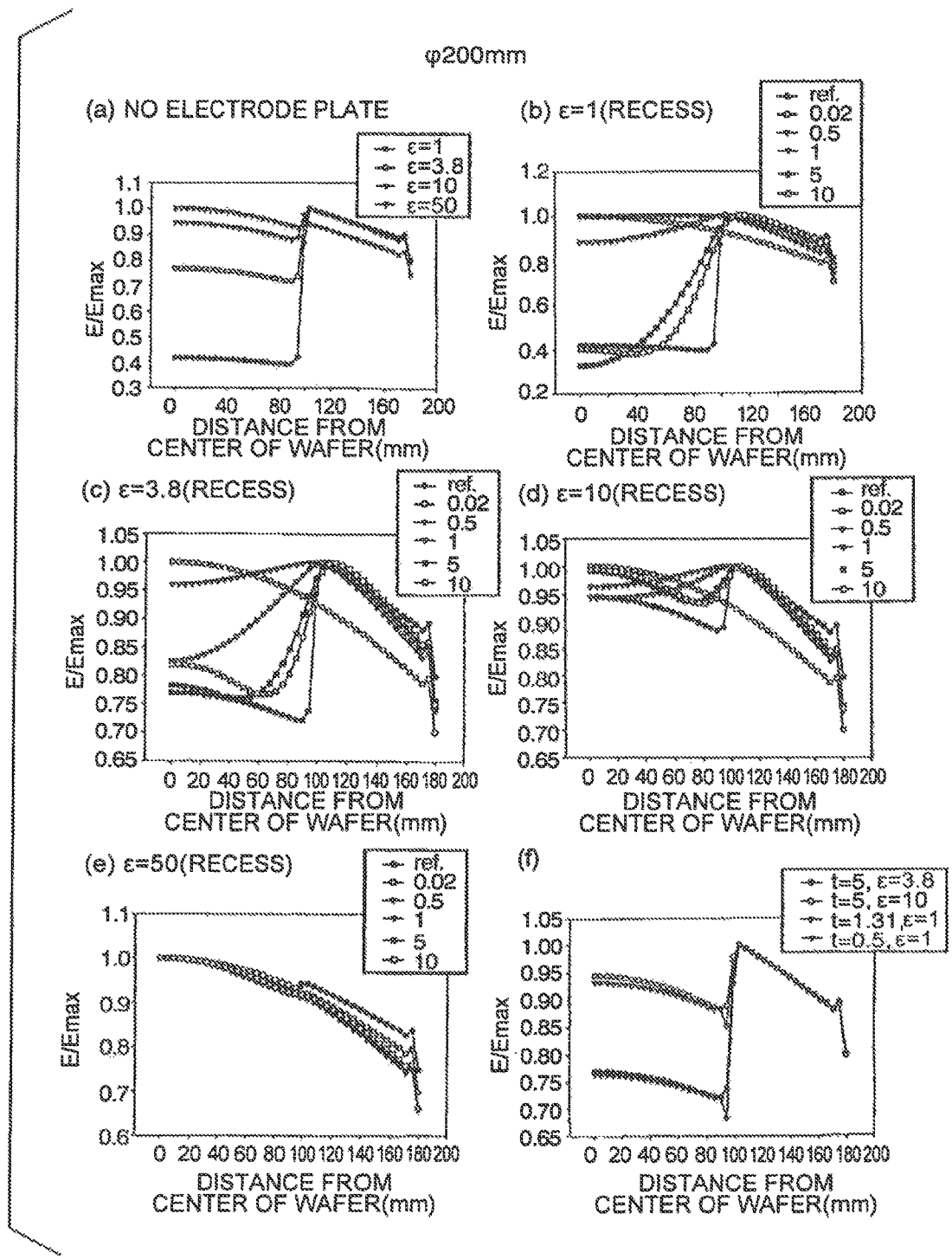
FIGS. 12(a) through 12(f) illustrate other profiles, respectively showing results related to examples of the present invention.

Other than such a lower-electrode-two-high-frequency-type apparatus as described above, the present invention can also be applied to an upper-and-lower-electrode-two-high-frequency-type etching apparatus, as shown in FIG. 10. Also in this case, the intensity of the electric field of the plasma in the surface of the wafer W can be uniformed, thus providing the etching process with significantly higher in-plane uniformity. Although not shown in FIG. 10, the support member 51 is grounded via a low pass filter (LPF), while the lower electrode 31 is grounded via a high pass filter (HPF). Furthermore, in a structure as shown in FIG. 1, a lower-electrode-one-high-frequency-type apparatus, which is not provided with the second high-frequency power source 6b for introducing the ions present in the plasma, is also applicable herein.

Other than the etching process, this invention may also be applied to another plasma processing apparatus configured for performing the aching process, CVD process or the like, with the plasma.

Furthermore, the region in which the recess 57 is provided is not limited to the region corresponding to the central portion of the wafer W. For instance, the recess 57 may be provided to have a ring-like shape, in a position corresponding to the periphery of the wafer W, along the circumference of the upper electrode 50. As the upper electrode 50 in this case, one construction can be mentioned, by way of example. Namely, in this construction, a first dielectric having a relative permittivity of, for example, $\varepsilon 1$ is embedded in the position corresponding to the central portion of the wafer W, with a second dielectric of a relative permittivity lower than ε1 being injected into the recess 57, while surrounding the first dielectric.

EXAMPLES

In order to study influence on the plasma, due to the amount of the dielectric of the upper electrode 50 and the temperature of the electrode plate 54 in the present invention, the magnitude of a sheath electric field (or voltage) was calculated, over a region from the central position to the periphery of the wafer W, in a position spaced away from and along the bottom face of the electrode plate 54 (i.e., 3 mm lower than the bottom face of the electrode plate 54), by simulation using Multiphysics (softwear produced by Ansis Co., Ltd.), with the relative permittivity of the upper electrode 50 being variously changed, as will be described below. It should be appreciated that the sheath electric field was used as an index for assessing the intensity of the electric field of the plasma because the sheath electric field is directly influenced by a state or condition (i.ea, distribution of the intensity of the electric field) of the plasma. In FIGS. 11 through 15, a ratio obtained by dividing each magnitude of the calculated sheath electric field by a maximum value thereof in the surface of the wafer W is shown, respectively. For the simulation, the calculation was performed, on the assumption that the resistivity of the plasma was 1.5 Ωm.

Example 1

Under the following conditions, the simulation as described above was performed. In this simulation, the magnitude of the sheath electric field was calculated, with the size of the recess 57 being fixed, while the relative permittivity of the dielectric in the recess 57 and the resistivity of the electrode plate 54 were changed, respectively.
(Simulation Conditions)
Diameter R of the recess 57: 100 mm
Thickness t2 of the recess 57: 5 mm
High frequency for the plasma generation: 100 MHz
Relative permittivity (ε) of the dielectric in the recess 57: 1/3.8/10/50
Resistivity (Ωm) of the electrode plate 54: no/0.02/0.5/1/5/10

As the material actually used for setting the dielectric in the recess 57 at the relative permittivity as described above, a vacuum (ε: 1), powder of silicon dioxide (ε: 3.8), powder of ceramics, e.g., $Al_2O_3$ (ε: 10 to 50) and the like can be mentioned. In the case of setting the resistivity into the range as described above, each desired range of the resistivity can be achieved, by controlling the temperature of the electrode plate 54 as well as by controlling a doping amount of suitable impurities, such as boron (B) and the like, by properly doping them into the electrode plate 54.
(Simulation Results)
FIG. 11(a) shows a result obtained by calculating the sheath electric field, without the electrode plate 54, while changing the relative permittivity of the dielectric in the recess 57, and FIGS. 11(b) through 11(e) show results obtained by calculating the sheath electric field, while changing the relative permittivity of the dielectric in the recess 57, as described above, as well as changing the resistivity of the electrode plate 54, respectively. In FIGS. 11(b) through 11(e), a value shown in FIG. 11(a), which was calculated without the electrode plate 54, is also shown, as a reference. It is noted that each legend shown in FIGS. 11(b) through 11(e) designates the resistivity of the electrode plate 54.

With this simulation, it was found that the intensity of the electric field of the plasma over a region corresponding to the recess 57 (i.e., a region from the center of the wafer W to an approximately 50 mm radial point) can be reduced by gradually decreasing the relative permittivity of the recess 57. Such reduction of the intensity of the electric field of the plasma can be attributed to the fact that the high frequency power for generating the plasma, supplied into the processing space 1, is locally decreased in the region corresponding to the recess 57. In addition, it was found that the intensity of the electric field of the plasma can be controlled, over the whole surface of the wafer W, by changing the resistivity of the electrode plate 54 together with the relative permittivity of the recess 57. Specifically, with decrease of the resistivity of the electrode plate 54, a gradient of the change in the intensity of the electric field of the plasma at a point corresponding to an outer periphery of the recess 57 (i.e., the 50 mm radial point from the center of the wafer W) becomes more gentle.

Therefore, even in the case in which the intensity of the electric field of the plasma is considerably increased in the central portion of the wafer W as described above, the magnitude of the sheath electric field (or intensity of the electric field of the plasma) can be controlled, corresponding to each state or condition of the plasma (i.e., the processing conditions or the like), in order to enhance the in-plane uniformity, by controlling the amount of the dielectric supplied into the recess 57 and the temperature of the electrode plate 54. Thus, the wafer W can be etched with higher in-plane uniformity.

Example 2

Another simulation similar to the simulation in the above Example 1 was carried out, with the recess 57 having a 200 mm diameter R. As shown in FIGS. 12(a) to 12(e), it was found that the intensity of the electric field of the plasma can be reduced, over the region corresponding to the recess 57 (i.e., a region from the center of the wafer W to an approximately 100 mm radial point) can be reduced by gradually decreasing the relative permittivity of the recess 57, in the same manner as in the above simulation. Similarly, it was found that the intensity of the electric field of the plasma can be controlled, over the whole surface of the wafer W, by changing the resistivity of the electrode plate 54 together with the relative permittivity of the recess 57.

Additionally, as shown in FIG. 12(f), the intensity of the electric field of the plasma can be similarly controlled, by changing the relative permittivity of the dielectric in the recess 57 as well as by changing the thickness t2 of the recess 57, from 5 mm to 1.31 mm or 0.5 mm.

Example 3

Figure 13:
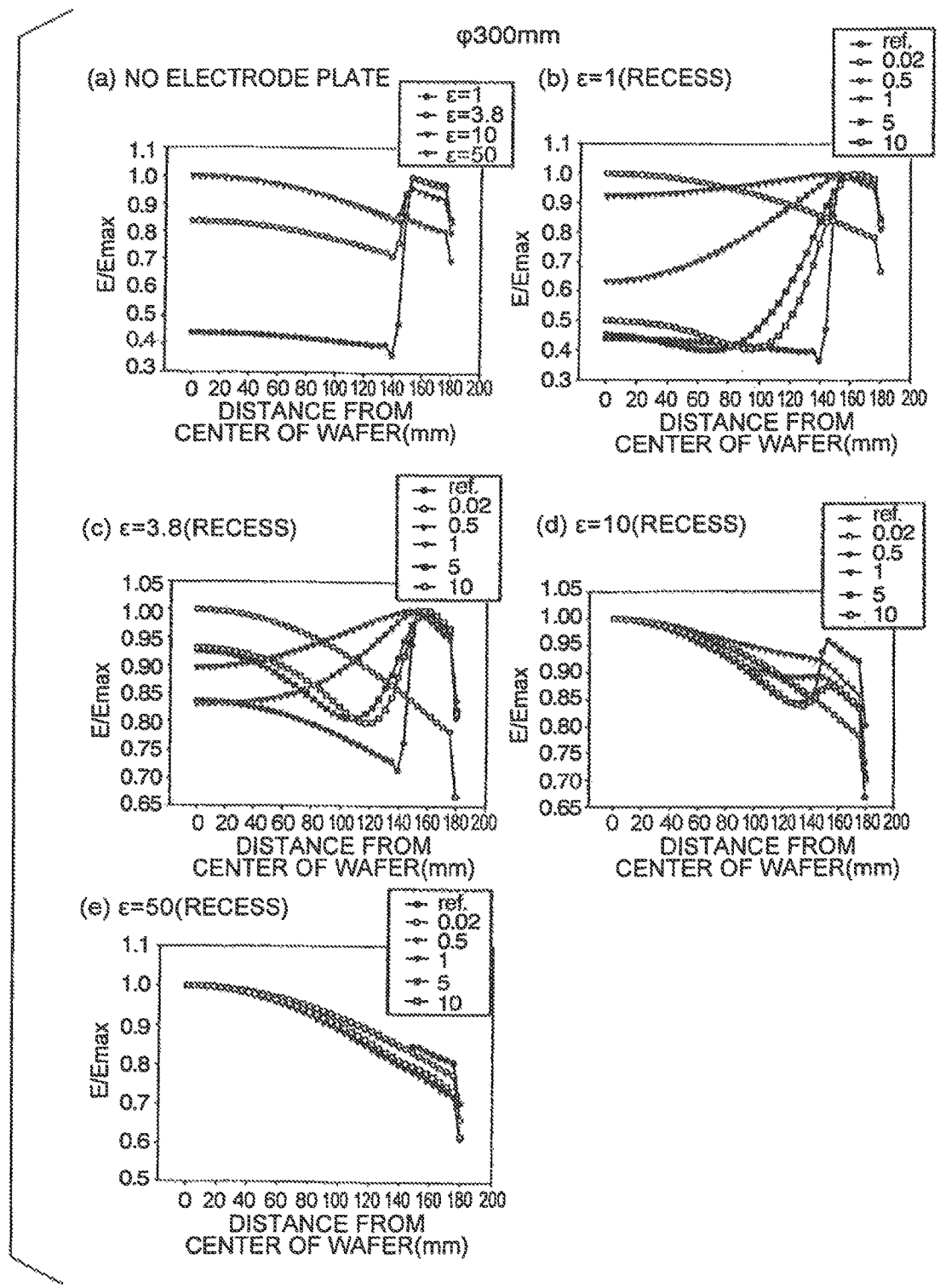
FIGS. 13(a) through 13(e) illustrate other profiles, respectively showing results related to examples of the present invention.

Next, as shown in FIG. 13, still another simulation similar to the simulation in the above Example 1 was carried out, with the recess 57 having a 300 mm diameter R. Also in this simulation, it was found that the intensity of the electric field of the plasma can be reduced, over the region corresponding to the recess 57 (i.e., a region from the center of the wafer W to an approximately 150 mm radial point) can be reduced by gradually decreasing the relative permittivity of the recess 57, in the same manner as described above. Again, it was found that the intensity of the electric field of the plasma can be controlled, over the whole surface of the wafer W, by changing the resistivity of the electrode plate 54 together with the relative permittivity of the recess 57. From these results, it was found that the diameter R of the recess 57 is preferably set at a value less than the diameter of the support member 51, for example, 300 mm or less, because the sheath electric field (or intensity of the electric field of the plasma) is changed, using each end (or peripheral end) of the dielectric in the recess 57 as a node (or fixed end).

Example 4

Next, in the above Example 3, another simulation for calculating the magnitude of the sheath electric field was carried out, with the thickness t2 of the recess 57 being set at 10 mm, while the relative permittivity of the dielectric in the recess 57 and the resistivity of the electrode plate 54 were respectively changed.

Figure 14:
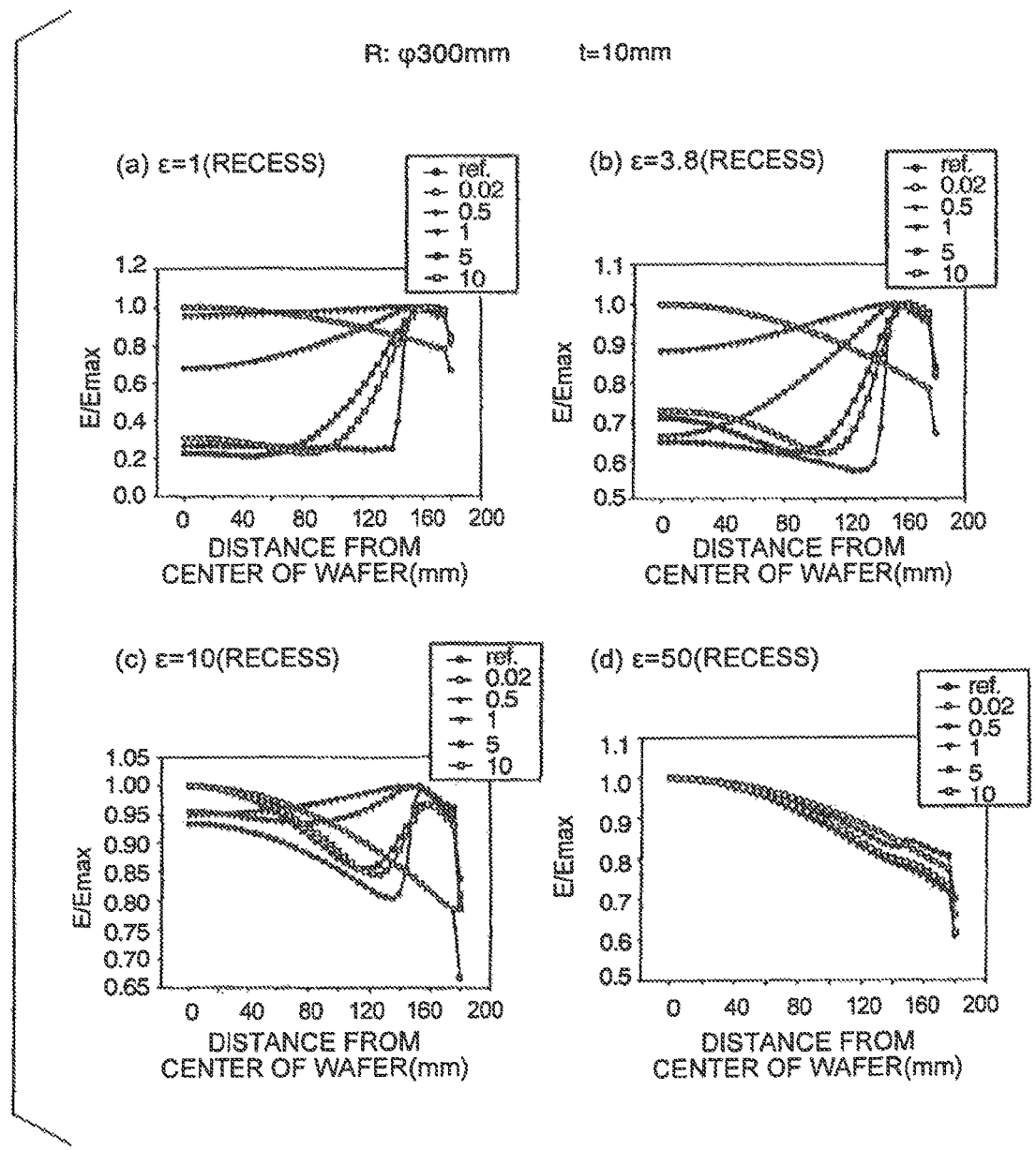
FIGS. 14(a) through 14(d) illustrate other profiles, respectively showing results related to examples of the present invention.

As a result, as shown in FIG. 14, it was found that the magnitude of the sheath electric field can be further reduced than the result of the above Example 3 (t2: 5 mm), by setting the thickness t2 of the recess 57 at 10 mm. Thus, it was found that the intensity of the electric field of the plasma can be controlled in a greater range by increasing the thickness t2 of the recess 57.

Example 5

Figure 15:
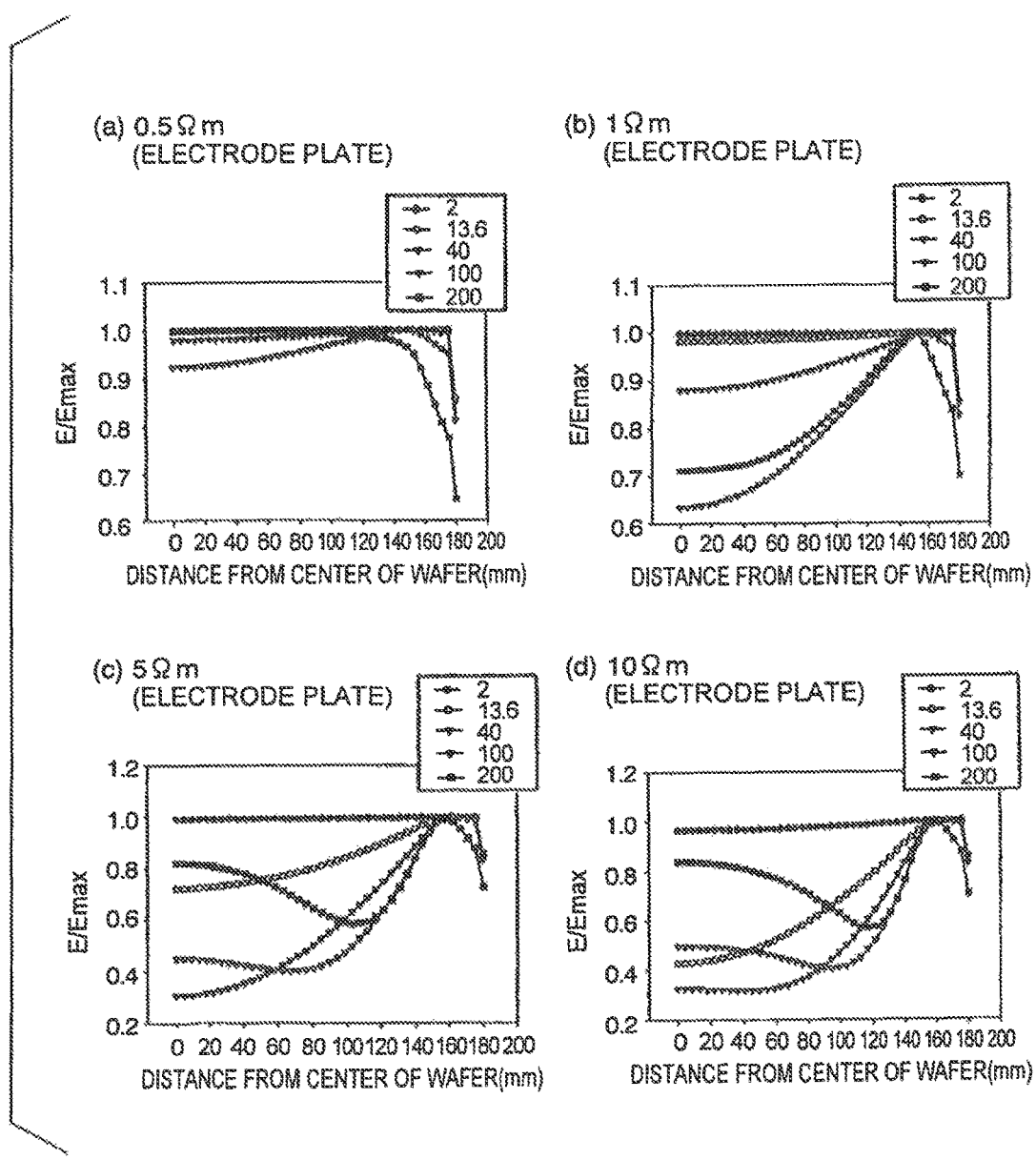
FIGS. 15(a) through 15(d) illustrate other profiles, respectively showing results related to examples of the present invention.

In this example, still another simulation was carried out, with the size of the recess 57 and the relative permittivity of the dielectric in the recess 57 being respectively fixed, while the resistivity of the electrode plate 54 and the frequency of the high frequency power used for the plasma generation were respectively changed.
(Simulation Conditions)
Diameter R of the recess 57: 300 mm
Thickness t2 of the recess 57: 5 mm
Relative permittivity ($\varepsilon$) of the dielectric in the recess 57: 1
High frequency for the plasma generation: 2/13.6/40/100/200 MHz
Resistivity ($\Omega$m) of the electrode plate 54: 0.5/1/5/10
(Simulation Results)
As a result, as shown in FIG. 15, it was found that the sheath electric field will be changed into a greater wave form, with increase of the frequency of the high frequency power. In addition, it was found that the degree of this change will be higher, with increase of the resistivity of the electrode plate 54.

From the results of the above Experiments 1 through 5, it was found that the distribution of the sheath electric field can be variously changed, by suitably changing the diameter R, thickness t2 and relative permittivity of the recess 57 (or amount and/or kind of each dielectric supplied into the recess 57) as well as by changing the resistivity of the electrode plate 54. Accordingly, it was found that the in-plane uniformity of the intensity of the electric field of the plasma can be substantially enhanced, by controlling the amount and/or kind of each dielectric supplied into the recess 57, dimensions of the recess 57, temperature of the electrode plate 54 and the like, in order to reduce or eliminate unwanted change of the intensity of the electric field of the plasma, even in the case in which the in-plane uniformity of the electron density of the plasma may tend to be considerably deteriorated by changing the frequency of the high frequency power and/or other processing parameters. This can be achieved, by carrying out the experiments and/or simulations as described above, in advance, in order to check or estimate how the intensity of the electric field will be changed. It is noted that each legend shown in FIG. 15 denotes the frequency of the high frequency power.

The invention claimed is:

1. An electrode for use in providing a plasma electric field having a uniform intensity in a plasma process, said electrode comprising:
    an electrode plate;
    a support member configured for supporting the electrode plate, the support member being formed from a conductive material and having (a) a dielectric injection space therein for receiving a fluid dielectric, (b) and a temperature control flow passage therein for conducting flow of a temperature control medium, the temperature control flow passage being above the dielectric injection space;
    a dielectric supply source connected with the dielectric injection space via a dielectric supply passage and configured for supplying dielectric fluid into the dielectric injection space;
    a dielectric discharge passage connected with the dielectric injection space and configured for discharging dielectric fluid from the dielectric injection space;
    a temperature control mechanism including the temperature control flow passage, a temperature control medium supply passage, and a temperature control medium discharge passage, the temperature control medium supply passage being connected with the temperature control flow passage and configured for supplying temperature control medium into the temperature control flow passage, the temperature control medium discharge passage being connected with the temperature control flow passage and configured for discharging temperature control medium from the temperature control flow passage, the dielectric supply source, the dielectric injection space, the dielectric supply passage, and the dielectric discharge passage being separate and independent from the temperature control medium supply passage, the temperature control flow passage, and the temperature control medium discharge passage; and
    a control unit configured to control simultaneously, an electrical capacitance of the support member and an electric resistance of the electrode plate to thereby provide the plasma electric field of uniform intensity, the control unit comprising a processor and controlling, in accordance with predetermined values obtained for each plasma process:
    (i) a kind of dielectric fluid in the dielectric injection space and an amount of dielectric fluid in the dielectric injection space by using the dielectric supply source and the dielectric discharge passage, and
    (ii) the temperature of the electrode by using the temperature control mechanism.

2. An electrode for use in a plasma process according to claim 1, wherein the temperature control mechanism further includes a heater on the support member.

3. An electrode for use in a plasma process according to claim 2, wherein the control unit causes the electrode plate to reach a temperature of 60° C. to 200° C. by controlling the temperature control medium and the heater.

4. A plasma processing apparatus comprising:
    a processing vessel having a processing space;
    an electrode provided in an upper portion of the processing vessel;

a temperature control mechanism for controlling the temperature of the electrode, the temperature control mechanism including a supply source of a temperature control medium, a temperature control medium supply passage, a temperature control flow passage, and a temperature control medium discharge passage;

a plasma generating member for generating a plasma in the processing vessel; and a control unit, wherein the electrode comprises:

an electrode plate;

a support member configured for supporting the electrode plate, the support member being formed from a conductive material and having therein (a) a dielectric injection space therein for receiving a fluid dielectric, and (b) the temperature control flow passage for conducting flow of temperature control medium, the temperature control flow passage being above the dielectric injection space;

a dielectric supply source connected with the dielectric injection space of the support member via a dielectric supply passage and configured for supplying dielectric fluid into the dielectric injection space; and a dielectric discharge passage connected with the dielectric injection space of the support member and configured for discharging dielectric fluid from the dielectric injection space, wherein the temperature medium supply source is connected with the temperature control flow passage via the temperature control medium supply passage, the temperature control medium supply passage being configured for supplying temperature control medium from the temperature control medium source into the temperature control flow passage;

wherein the temperature control medium discharge passage is connected with the temperature control flow passage and configured for discharging temperature control medium from the temperature control flow passage wherein, the dielectric supply source, the dielectric injection space, the dielectric supply passage, and the dielectric discharge passage are separate and independent from the temperature control medium supply source, temperature control medium flow passage, and temperature control medium discharge passage;

wherein the control unit is configured to control simultaneously, an electrical capacitance of the support member and an electric resistance of the electrode plate to thereby provide the plasma electric field of uniform intensity, the control unit controlling, in accordance with predetermined values obtained for each plasma process:

(i) a kind of dielectric fluid in the dielectric injection space and an amount of dielectric fluid in the dielectric injection space by using the dielectric supply source and the dielectric discharge passage, and (ii) the temperature of the electrode by using the temperature control mechanism, wherein the control unit has a CPU and a memory including a computer program, the memory storing information about the kind of dielectric, the amount of dielectric and the resistance of the electrode plate suitable for achieving a proper intensity for the plasma electric field, and wherein the control unit uses the CPU to compute appropriate control values on the basis of the stored information to control the plasma electric field intensity.

5. The plasma processing apparatus according to claim 4, wherein the temperature control mechanism further includes a heater on the support member.

6. The plasma processing apparatus according to claim 5, wherein the control unit causes the electrode plate to reach a temperature of 60° C. to 200° C. by controlling the temperature control medium and the heater.

* * * * *